US010031205B2

(12) United States Patent
Hanada et al.

(10) Patent No.: US 10,031,205 B2
(45) Date of Patent: Jul. 24, 2018

(54) MAGNETIC RESONANCE IMAGING APPARATUS AND MAGNETIC RESONANCE IMAGING METHOD

(71) Applicant: HITACHI, LTD., Tokyo (JP)

(72) Inventors: Hikaru Hanada, Tokyo (JP); Miyuki Takahashi, Tokyo (JP); Kuniharu Oka, Tokyo (JP); Masahiro Takizawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 252 days.

(21) Appl. No.: 14/909,807

(22) PCT Filed: Aug. 20, 2014

(86) PCT No.: PCT/JP2014/071771
§ 371 (c)(1),
(2) Date: Feb. 3, 2016

(87) PCT Pub. No.: WO2015/033779
PCT Pub. Date: Mar. 12, 2015

(65) Prior Publication Data
US 2016/0170001 A1   Jun. 16, 2016

(30) Foreign Application Priority Data
Sep. 3, 2013 (JP) .................. 2013-182499

(51) Int. Cl.
*G01R 33/565* (2006.01)
*G01R 33/36* (2006.01)
(Continued)

(52) U.S. Cl.
CPC ....... *G01R 33/56509* (2013.01); *G01R 33/36* (2013.01); *G01R 33/385* (2013.01);
(Continued)

(58) Field of Classification Search
None
See application file for complete search history.

(56) References Cited

U.S. PATENT DOCUMENTS

2009/0115794 A1* 5/2009 Fukuta ................ G01R 33/561
345/581
2010/0141253 A1 6/2010 Takizawa et al.
(Continued)

FOREIGN PATENT DOCUMENTS

JP   2005-152175   6/2005
JP   2013-43033    3/2013
(Continued)

OTHER PUBLICATIONS

International Search Report in PCT/JP2014/071771 dated Nov. 25, 2014.

*Primary Examiner* — Rodney Bonnette
(74) *Attorney, Agent, or Firm* — Cooper & Dunham LLP

(57) ABSTRACT

The present invention obtains high-quality images even in a case of measurement with a radial sampling method. For this purpose, pre-measurement is performed to extract only a component different for each blade from among shift amounts from among echo signals, and a shift amount in k-space of an echo signal by the said component is reflected to a reconstruction process. In the pre-measurement, echo signals are obtained respectively by applying readout gradient magnetic field pulses that change the polarity to the positive and negative and that have the same pulse shape as readout gradient magnetic field pulses to be used in an image acquisition sequence. A shift amount is obtained for each axis of X, Y, and Z of an MRI apparatus as a variation amount of a phase difference between both the echo signals.

11 Claims, 12 Drawing Sheets

(51) Int. Cl.
*G01R 33/385* (2006.01)
*G01R 33/48* (2006.01)
*G01R 33/561* (2006.01)

(52) U.S. Cl.
CPC ....... *G01R 33/482* (2013.01); *G01R 33/4818* (2013.01); *G01R 33/4824* (2013.01); *G01R 33/565* (2013.01); *G01R 33/5617* (2013.01); *G01R 33/56563* (2013.01)

(56) References Cited

U.S. PATENT DOCUMENTS

| | | | |
|---|---|---|---|
| 2010/0164495 A1 | 7/2010 | Takizawa et al. | |
| 2011/0249881 A1* | 10/2011 | Ootsuka | G01R 33/56572 382/131 |
| 2014/0055137 A1* | 2/2014 | Kamada | A61B 5/055 324/309 |
| 2016/0054415 A1* | 2/2016 | Takahashi | A61B 5/055 324/318 |

FOREIGN PATENT DOCUMENTS

| | | |
|---|---|---|
| JP | 2013-46837 | 3/2013 |
| WO | WO 2008/152937 | 12/2008 |

* cited by examiner

FIG.2
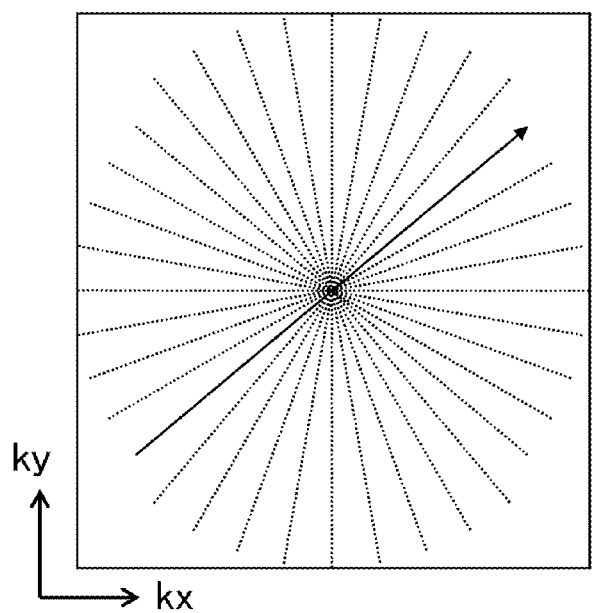
(a)
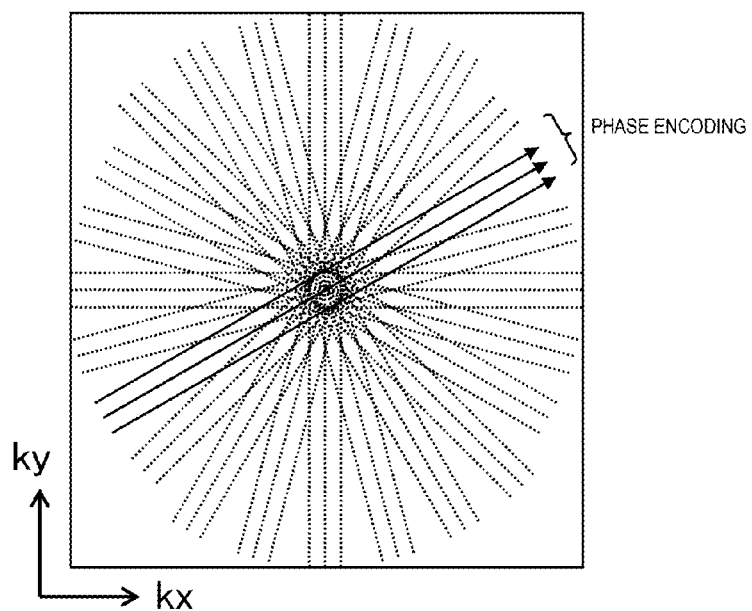
(b) PHASE ENCODING

FIG.3
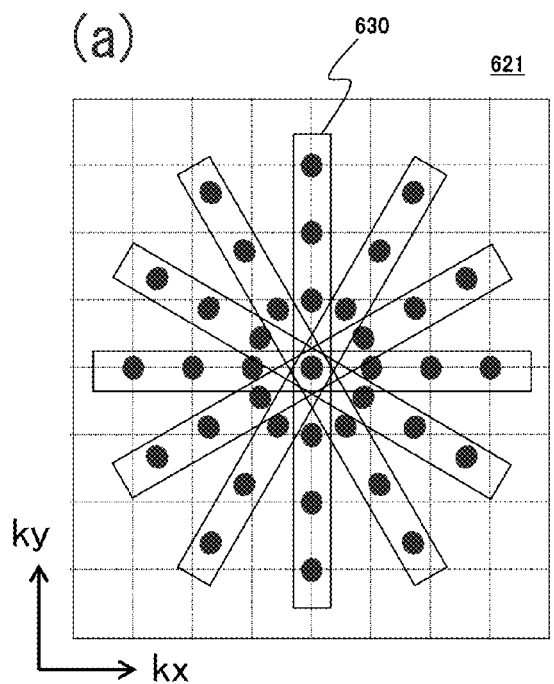
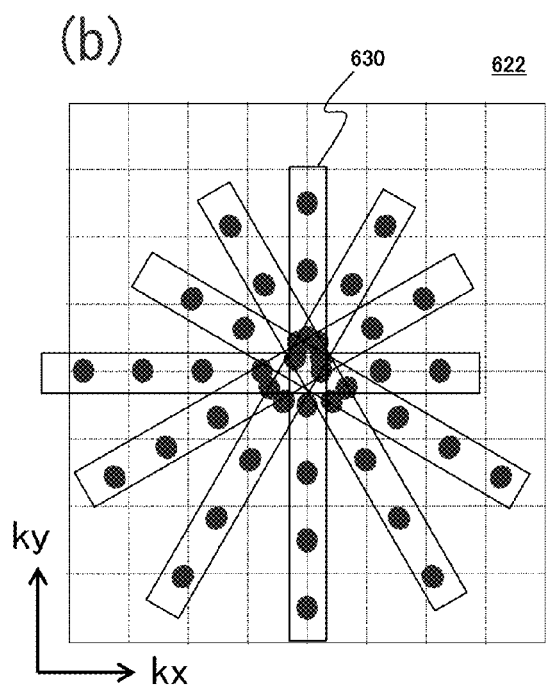

FIG.10
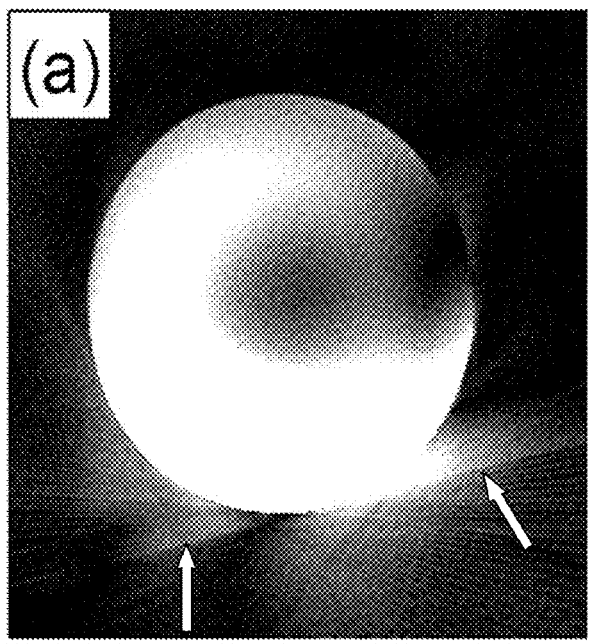
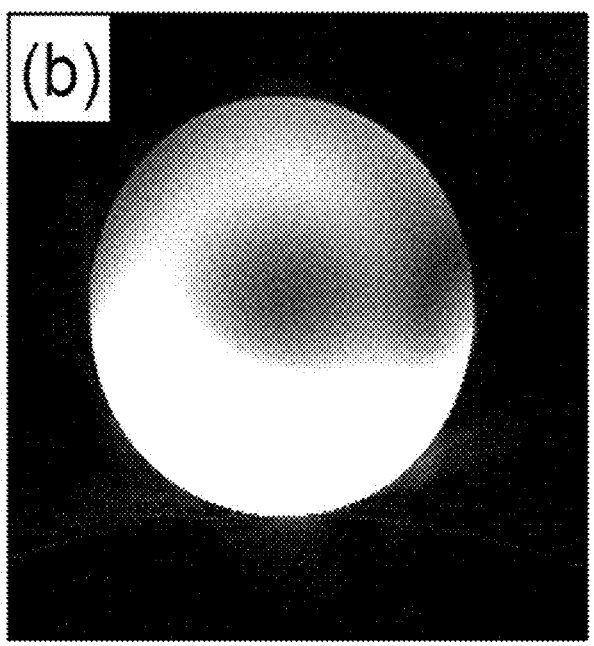

FIG.11
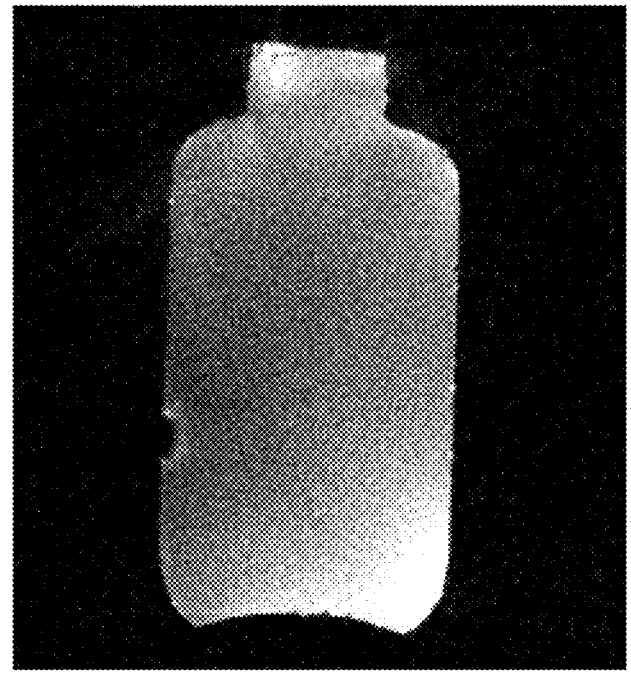
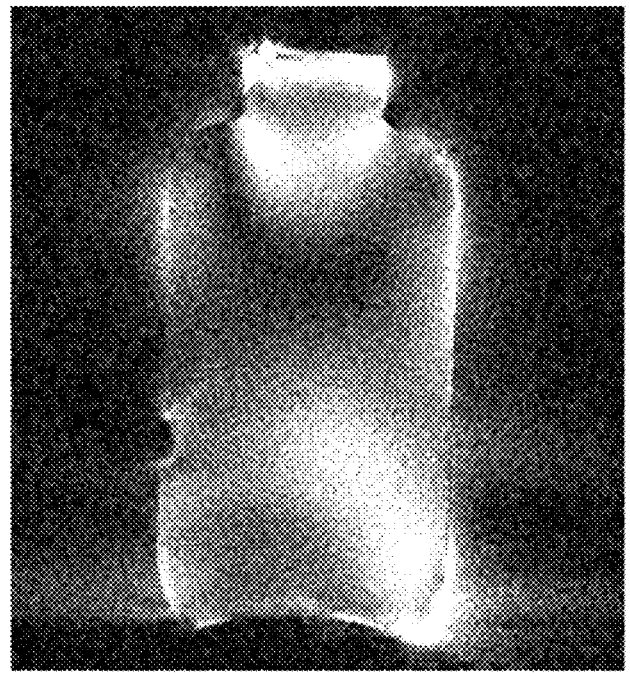

MAGNETIC RESONANCE IMAGING APPARATUS AND MAGNETIC RESONANCE IMAGING METHOD

TECHNICAL FIELD

The present invention relates to a magnetic resonance imaging (hereinafter, referred to as "MRI") apparatus that measures a nuclear magnetic resonance signal (hereinafter, referred to as "NMR signal") from hydrogen, phosphorus, and the like of an object and images nuclear density distribution, relaxation time, and the like, and in particular to an imaging technique using a radial sequence that samples k-space radially.

BACKGROUND ART

The MRI apparatus is an apparatus that measures an NMR signal generated by atomic nucleus spin comprising tissue of an object, in particular human body and two-dimensionally or three-dimensionally images shapes and functions of the head, abdomen, extremities, and the like. In imaging, an object is disposed in a static magnetic field (a polarizing magnetic field $B_0$), a high-frequency magnetic field pulse is applied together with a slice-selective gradient magnetic field pulse in order to selectively excite a certain region, and then a readout gradient magnetic field pulse is applied within the excitation range in order to perform phase or frequency encoding.

The readout gradient magnetic field pulse generates a magnetic field gradient in an arbitrary direction in order to generate a magnetic field intensity gradient in the static magnetic field space. Since the atomic nucleus spin performs precession at a frequency according to a gradient magnetic field intensity and the magnetic rotation ratio, an echo signal can be decomposed into a component of each frequency i.e., position by measuring an NMR signal (echo signal) in a state where a readout gradient magnetic field pulse was applied to perform frequency analysis represented by the Fourier transform. In the MRI apparatus, a group of encoded echo signals with a different phase or frequency is disposed in a measurement space (generally referred to as "k-space" and referred to as k-space hereinafter) before performing the two-dimensional or three-dimensional Fourier transform to reconstruct an image.

As a method for arranging echo signals, there is a radial sampling method in which echo signals are radially arranged around the origin of k-space while changing a rotation angle. In the radial sampling method, a group of measurement data acquired by sampling echo signals at respective angles is referred to as "Blade". Since the blades at respective angles are intersected with each other and arranged in k-space in the radial sampling method, artifacts and uneven brightness are caused in case of an improper positional relationship between the blades, which results in image quality deterioration. The improper positional relationship is caused by shifting from a position in k-space specified by the echo signals in a pulse sequence due to various factors.

As a technique for correcting an error of the positional relationship between the blades, there is a technique for calculating a shift amount of echo signals in k-space from phase distribution of data in which the Fourier transform was performed for the echo signals of respective blades and reflecting the shift amount to k-space arrangement processing of the echo signals (for example, refer to Patent Literature 1). Also, there is a technique for calculating a shift amount in a phase encoding direction from a temporal change of peak positions of the echo signals in the phase encoding direction and using the shift amount for correcting the pulse sequence.

CITATION LIST

Non-Patent Literature

PTL 1: International Publication No. 2007/013423

SUMMARY OF INVENTION

Technical Problem

An echo signal to be received includes two components: a shift common to all the blades (hereinafter, referred to as "static error") and a shift different for each blade (hereinafter, referred to as "dynamic error"). The static error provides the same shift amount for all the blades in k-space, and on the other hand, the dynamic error provides a shift amount respectively in a frequency encoding direction of each blade. Therefore, an inappropriate positional relationship between blades is caused by the shift due to the dynamic error.

However, in the method shown in PTL 1, the dynamic and static errors are not distinguished to calculate a shift amount. Therefore, the static error is also corrected in a blade where a frequency encoding direction corresponds to a direction of a shift due to the static error, and the static error is not corrected in a blade where a frequency encoding direction does not correspond to a direction of a shift due to the static error. Hence, a positional relationship between the blades cannot be corrected appropriately. Particularly, in case of imaging in a region where static errors are dominant and static magnetic field homogeneity is low as well as in a case of measuring using a reception RF coil with local sensitivity distribution, a positional relationship between the blades is not corrected appropriately, and artifacts tend to appear.

Also, in the method shown in PTL 1, an echo signal needs to have a shape with a single peak. In case of measuring using a gradient echo sequence subject to influence of static magnetic field inhomogeneity or a reception RF coil with local sensitivity distribution, an echo shape tends not to have a single peak, and this method cannot be applied to such a case.

Furthermore, in a method using a temporal change of a peak position of an echo signal, it is based on that the echo signal shape does not vary over time. However, in case of the gradient echo sequence or the like that is subject to influence of static magnetic field inhomogeneity, the echo signal shape varies over time, and this method cannot be applied.

The present invention was made in light of the above circumstances and has a purpose to provide a technique for acquiring a high-quality image even in case of measuring with the radial sampling method.

Solution to Problem

The present invention performs pre-measurement to separate a plurality of factors that shift an echo signal position in k-space and calculates a shift amount for each blade to reflect it to the reconstruction process. In the pre-measurement, a readout gradient magnetic field pulse to be used in an image acquisition sequence and a readout gradient magnetic field pulse with the same pulse shape in which only the positive and negative polarities were changed are applied in order to acquire echo signals respectively. A shift amount is calculated from an inclination variation amount of a data row to be obtained by performing the Fourier transform for both the echo signals and calculating a phase difference and is obtained for each of the X, Y, and Z axes of the MRI apparatus.

Advantageous Effects of Invention

Even in case of measuring with the radial sampling method, a high-quality image can be acquired.

BRIEF DESCRIPTION OF DRAWINGS

FIG. 2(a) is a schematic diagram of a k-space trajectory of radial scanning, and FIG. 2(b) is a schematic diagram of a k-space trajectory of hybrid radial scanning.

FIG. 3(a) is an explanatory diagram for explaining the data arrangement in k-space in case of an appropriate positional relationship between blades, and FIG. 3(b) is an explanatory diagram for explaining the data arrangement in k-space in case of an inappropriate positional relationship between blades.

FIG. 10 is an explanatory diagram for explaining the effect of the first embodiment, FIG. 10(a) shows an image generated by a conventional method, and FIG. 10(b) shows an image generated by the method of the first embodiment.

FIG. 11 is an explanatory diagram for explaining the effect of the first embodiment, FIG. 11(a) shows an image generated by a conventional method, and FIG. 11(b) shows an image generated by the method of the first embodiment.

DESCRIPTION OF EMBODIMENTS

First Embodiment

Hereinafter, the embodiments of the present invention will be described using the attached diagrams. Additionally, in all the diagrams to describe the embodiments of the invention, unless otherwise stated, the same symbol is given to the same function, and the repeated explanation will be omitted.

<Apparatus Components>

First, an example overview of the MRI apparatus related to the present invention will be described based on FIG. 1.

Figure 1:
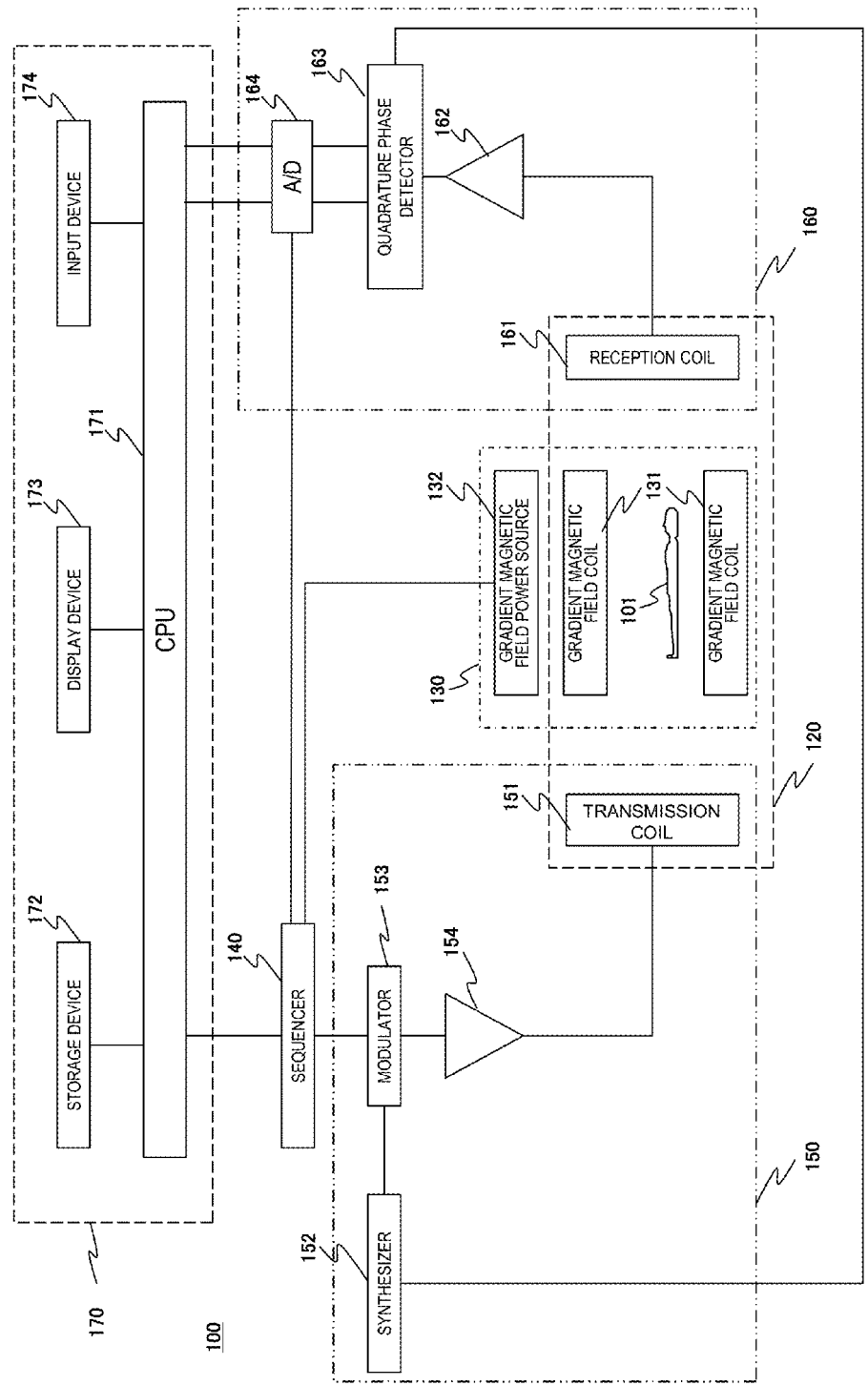
FIG. 1 is a block diagram of the MRI apparatus of the first embodiment.

FIG. 1 is a block diagram showing the overall configuration of an embodiment of the MRI apparatus related to the present invention.

The MRI apparatus 100 of the present embodiment acquires a tomographic image of an object using the NMR phenomenon and is provided with the static magnetic field generation system 120, the gradient magnetic field generation system 130, the high-frequency magnetic field generation system (hereinafter, referred to as "transmission system") 150, the high-frequency magnetic field detection system (hereinafter, referred to as "reception system") 160, the control processing system 170, and the sequencer 140.

The static magnetic field generation system 120 generates a homogeneous static magnetic field in a direction orthogonal to the body-axis direction in a space around the object 101 in case of the vertical magnetic field type and in the body-axis direction in case of the horizontal magnetic field type and is provided with a static magnetic field generation source of a permanent magnet type, a normal conduction type, or a super conduction type to be disposed around the object 101.

The gradient magnetic field generation system 130 is provided with the gradient magnetic field coils 131 wound in the three axis directions of X, Y, and Z that are the coordinate system (apparatus coordinate system) of the MRI apparatus 100 and the gradient magnetic field power source 132 driving the respective gradient magnetic field coils and applies gradient magnetic fields Gx, Gy, and Gz in the three axis directions of X, Y, and Z by driving the gradient magnetic field power source 132 of the respective gradient magnetic field coils 131 according to a command from the sequencer 140 to be described later.

During imaging, a slice direction gradient magnetic field pulse is applied in a direction orthogonal to a slice plane (imaging cross section) in order to set the slice plane for the object 101, and a phase encoding direction gradient magnetic field pulse and a frequency encoding direction gradient magnetic field pulse are applied in the other two directions orthogonal to the slice plane and to each other in order to encode positional information of the respective directions into echo signals.

The transmission system 150 irradiates a high-frequency magnetic field pulse (hereinafter, referred to as "RF pulse") to the object 101 in order to cause nuclear magnetic resonance to atomic nucleus spin of atoms comprising living tissue of the object 101 and is provided with the high-frequency oscillator (synthesizer) 152, the modulator 153, the high-frequency amplifier 154, and the high-frequency coil on the transmission side (transmission coil) 151. The high-frequency oscillator 152 generates and outputs an RF pulse.

The modulator 153 amplitude-modulates an output RF pulse at a timing commanded from the sequencer 140, and the high-frequency amplifier 154 amplifies the amplitude-modulated RF pulse in order to supply to the transmission coil 151 disposed in the vicinity of the object 101. The transmission coil 151 irradiates the supplied RF pulse to the object 101.

The reception system 160 detects a nuclear magnetic resonance signal (echo signal, NMR signal) to be emitted by nuclear magnetic resonance of the spin of atomic nuclei comprising living tissue of the object 101 and is provided with the high-frequency coil (reception coil) 161 on the reception side, the signal amplifier 162, the quadrature phase detector 163, and the A/D converter 164. The reception coil 161 is disposed in the vicinity of the object 101 to detect a response NMR signal of the object 101 excited by an electromagnetic wave irradiated from the transmission coil 151. The detected NMR signal is amplified in the signal amplifier 162, divided into orthogonal two-system signals by the quadrature phase detector 163 at a timing commanded from the sequencer 140, respectively converted into digital amounts by the A/D converter 164, and sent to the control processing system 170. In the present embodiment, the description will be made taking a case of using the reception coil 161 with a plurality of channels as an example.

The sequencer 140 applies an RF pulse and a gradient magnetic field pulse according to commands from the control processing system 170. Specifically, various commands required for data collection of a tomographic image of the object 101 are transmitted to the transmission system 150, the gradient magnetic field generation system 130, and the reception system 160 according to commands from the control processing system 170.

The control processing system 170 controls the entire MRI apparatus 100, performs calculation such as various data processing, displays and stores the processing results, and the like, and is provided with the CPU 171, the storage device 172, the display device 173, and the input device 174. The storage device 172 is comprised of an internal storage device such as a hard disk and an external storage device such as an external hard disk, an optical disk, and a magnetic disk. The display device 173 is a display device such as a CRT display and a liquid crystal display. The input device 174 is an interface to input various control information of the MRI apparatus 100 and control information processed by the control processing system 170, and, for example, is provided with a trackball or a mouse and a keyboard. The input device 174 is disposed in the vicinity of the display device 173. An operator interactively inputs commands and data required for various types of processing of the MRI apparatus 100 through the input device 174 while checking the display device 173.

The CPU 171 executes a program previously stored in the storage device 172 according to a command input by an operator in order to realize the operation control of the MRI apparatus 100 and each process of the control processing system 170 such as various data processes. Commands to the above sequencer 140 are made according to a pulse sequence previously stored in the storage device. Also, when data from the reception system 160 is input to the control processing system 170, the CPU 171 executes signal processing, image reconstruction processing, and the like, displays the resulting tomographic image of the object 101 on the display device 173, and then stores it in the storage device 172.

The transmission coil 151 and the gradient magnetic field coils 131 are installed opposite the object 101 in case of the vertical magnetic field type or so as to surround the object 101 in case of the horizontal magnetic field type in the static magnetic field space of the static magnetic field generation system 120 in which the object 101 is inserted. Also, the reception coil 161 is installed opposite the object 101 or so as surround the object 101.

Currently, a nuclide that is prevalent in a clinical practice and to be imaged by an MRI apparatus is a hydrogen atomic nucleus (proton) that is a main component substance of the object 101. The MRI apparatus 100 two- or three-dimensionally images the shapes and functions of the head, abdomen, extremities, and the like of a human body by imaging information about spatial distribution of proton density and spatial distribution of relaxation time in an excited state.

<Radial Sampling Method>

In the present embodiment, the radial sampling method of the non-orthogonal sampling methods is used as measurement to acquire an image. In the radial sampling method, echo signals are radially arranged around the origin of k-space while changing a rotation angle. A group of measurement data acquired by sampling the echo signals is referred to as "blade".

There are two types of the radial sampling methods: (1) arranging one echo signal to which phase encoding is not added as a blade and (2) arranging an echo signal group to which phase encoding is added as a blade. Here, in order to distinguish both the methods, (1) is referred to as "radial scanning", and (2) is referred to as "hybrid-radial scanning". Both the methods are referred to as the radial sampling method comprehensively.

The schematic diagrams of the k-space trajectories in the radial scanning and the hybrid-radial scanning are shown in FIGS. 2(a) and 2(b). FIG. 2(a) shows the trajectory 611 of k-space by the radial scanning, and FIG. 2(b) shows the k-space trajectory 612 by the hybrid-radial scanning. These radial sampling methods are used for the purpose to reduce artifacts caused by motion of the object 101.

In the radial sampling method, as described above, the blades at different angles are intersected with each other and arranged in k-space. In a case where a positional relationship between the blades becomes improper because peak positions of echo signals are shifted from the origin, artifacts and uneven brightness are caused, which results in image quality deterioration.

FIG. 3(a) schematically shows the data arrangement 621 in k-space in case of a proper positional relationship between the blades 630, and FIG. 3(b) schematically shows the data arrangement 622 in k-space in case of an improper positional relationship between the blades 630. The black spots in the diagram show points to be sampled using the radial sampling method.

<Occurrence Factor of Positional Relationship Misalignment>

The position shifts of the blades 630 are generated because the peak positions of the echo signals are shifted from the origin. The occurrence factor of the peak position shifts includes an application area error of a readout gradient magnetic field pulse, static magnetic field inhomogeneity, and sensitivity distribution of the reception coil 161.

The application area error of the readout gradient magnetic field pulse is caused by an eddy current and an incomplete response of the gradient magnetic field generation system. If the application area error of the readout gradient magnetic field pulse is caused, echo signals to be acquired are shifted in the frequency encoding direction. In the radial sampling method, shift amounts in the frequency encoding direction are different for each blade because output ratios in the gradient magnetic field generation systems of the three axes of X, Y, and Z are different for each blade. Therefore, the shift due to the application area error of the readout gradient magnetic field pulse is a dynamic error, which results in the factor of misalignment in the positional relationship between the blades.

The static magnetic field inhomogeneity is caused depending on the shape of the static magnetic field generation system, the shape of the object 101 to be disposed in the static magnetic field generation system, and the like. The static magnetic field inhomogeneity also shifts echo signals in k-space.

Since the static magnetic field inhomogeneity is irrelevant to a gradient magnetic field, a shift amount and a direction of an echo signal caused by the static magnetic field inhomogeneity are common to all the blades. Therefore, a shift due to the static magnetic field inhomogeneity is a static error, and misalignment does not occur to the positional relationship between the blades due to the error.

Sensitivity distribution of the reception coil 161 is determined according to a shape of the reception coil 161, and a coil with a smaller diameter has steeper sensitivity distribution. Generally, a phase of a signal to be received is changed according to a distance from the reception coil 161. Consequently, this also appears as a shift of an echo signal in k-space. A shift amount and a direction of an echo signal caused by the reception coil 161 are common to all the blades. Therefore, a shift due to the sensitivity distribution of the reception coil 161 is a static error, and misalignment does not occur to the positional relationship between the blades due to the error.

If dynamic error and static errors are processed without distinguishing them, the static error is also corrected in a blade where a shift direction due to the static error corresponds to the frequency encoding direction, and the static error is not corrected in a blade where the shift direction due to the static error does not correspond to the frequency encoding direction. The static error provides the same shift amount to all the blades in k-space. Nevertheless, because a correction degree of the static error varies for each blade, a positional relationship between blades cannot be corrected properly.

The present embodiment corrects only a shift component causing misalignment to the positional relationship between blades, i.e. a dynamic error and has a purpose to provide an MRI apparatus that can acquire a satisfactory image using the radial scan method even in any of the following three cases: 1) a case where dynamic and static errors coexist; 2) a case where imaging is performed using the reception coil 161 with local sensitivity distribution; and 3) a case of using a pulse sequence subject to static magnetic field inhomogeneity such as a gradient echo sequence.

<Functional Configuration of Control Processing System>

Figure 4:
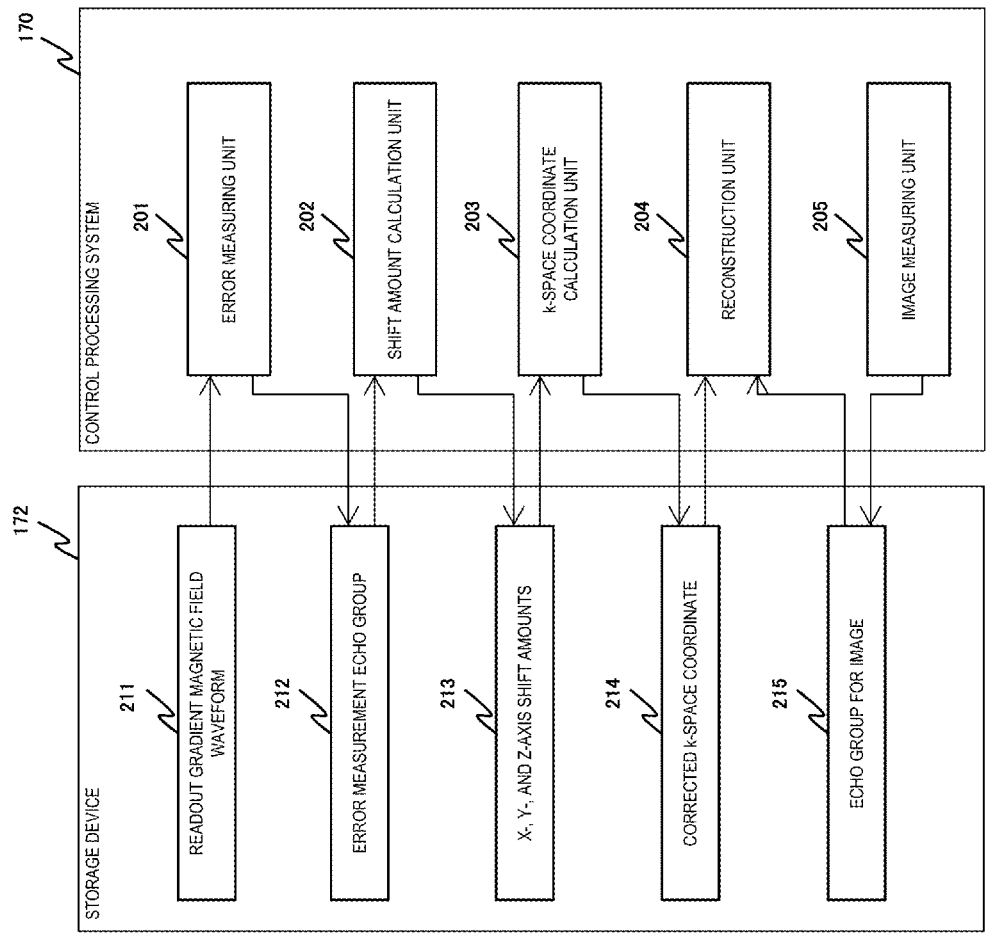
FIG. 4 is an explanatory diagram for explaining the functional blocks of the control processing system of the first embodiment and data to be stored in the storage device.

In order to achieve this, the control processing system 170 of the present embodiment is comprised of the error measuring unit 201 that performs an error measurement process, the shift amount calculation unit 202 that performs a shift amount calculation, the k-space coordinate calculation unit 203 that performs a k-space coordinate calculation process, the reconstruction unit 204 that performs a radial scanning reconstruction process, and the image measuring unit 205 that executes an image acquisition sequence and obtains an echo signal group to reconstruct an image as shown in FIG. 4.

These functions of each unit of the control processing system 170 are achieved by that the CPU 171 loads a program pre-stored in the storage device 172 into a memory and executes the program.

Data used for each process, data generated during a process, and data generated after a process are stored in the storage device 172.

The image measuring unit 205 performs measurement to acquire an image to be used for a diagnosis (hereinafter, referred to as an image acquisition sequence). In the present embodiment, according to a pulse sequence of the radial sampling method, each unit is controlled, and then echo signals are collected (the imaging echo group 215) and arranged in k-space. Controlling each unit includes applying a readout gradient magnetic field pulse. In the present embodiment, an output ratio of the gradient magnetic field generation systems of the three axes of X, Y, and Z of an apparatus coordinate system unique to the MRI apparatus 100 is adjusted for each blade to generate the readout gradient magnetic field pulse.

Specifically, in order to execute an image acquisition sequence, applying a readout gradient magnetic field pulse is controlled so that echo signals are arranged along a plurality of scanning trajectories to be obtained by rotating one or more blades having a parallel linear scanning trajectory at different angles around a predetermined reference point (for example, the origin) in k-space. Then, the arranged echo signals are sampled in order to acquire a non-orthogonal coordinate system of measurement data.

The reconstruction unit 204 reconstructs an image from the measurement data acquired in the image acquisition sequence using a publicly known radial-scan reconstruction process. That is, the measurement data is re-arranged in orthogonal coordinate system k-space by gridding, and then the re-arranged data is used for reconstructing an image. In the present embodiment, the corrected k-space coordinate 214 to be described later is used for gridding.

The error measuring unit 201 performs measurement (error measurement) for acquiring data (the error measurement echo group 212) to calculate a static error and a dynamic error (an error measurement process). The error measurement is performed using the readout gradient magnetic field waveform 211 that is a waveform of a readout gradient magnetic field pulse to be used for an image acquisition sequence. Also, the error measurement process is performed in prior to the image acquisition sequence separately from controlling the image acquisition sequence. The details of the present process will be described later.

The shift amount calculation unit 202 separates a plurality of factors that shift echo signal positions in k-space from the error measurement echo group 212 to calculate a shift amount for each blade. Here, a dynamic error in the shift amounts of the echo signal, i.e. a shift amount component different for each blade (hereinafter, simply referred to also as a shift amount) is calculated. The shift amount calculation unit 202 of the present embodiment calculates the shift amount for each of the X, Y, and Z axes in the shift amount calculation process (the X-, Y-, and Z-axis shift amounts 213). The shift amount to be calculated is generated due to an application area error of a readout gradient magnetic field pulse. Also, the calculation is performed using the error measurement echo group 212 obtained as a result of the error measurement. The details of the present process will be described later.

The k-space coordinate calculation unit 203 reflects the X-, Y-, and Z-axis shift amounts 213 calculated by the shift amount calculation unit 202, corrects coordinates of measurement data of main imaging in non-orthogonal system k-space, and then calculates the corrected k-space coordinate 214 (a k-space coordinate calculation process). Here, a shift amount in the frequency encoding direction for each blade is calculated from the shift amount 213 in each axis direction, and then the calculated shift amount is added to a k-space coordinate of the measurement data of the corresponding blade obtained in the image acquisition sequence in order to obtain the corrected k-space coordinate 214. The details of the present process will be described later.

The present embodiment is characterized by comprising the error measuring unit 201, the shift amount calculation unit 202, and the k-space coordinate calculation unit 203. Hereinafter, the processes by these units will be described in detail.

<Error Measurement Process>

Figure 5:
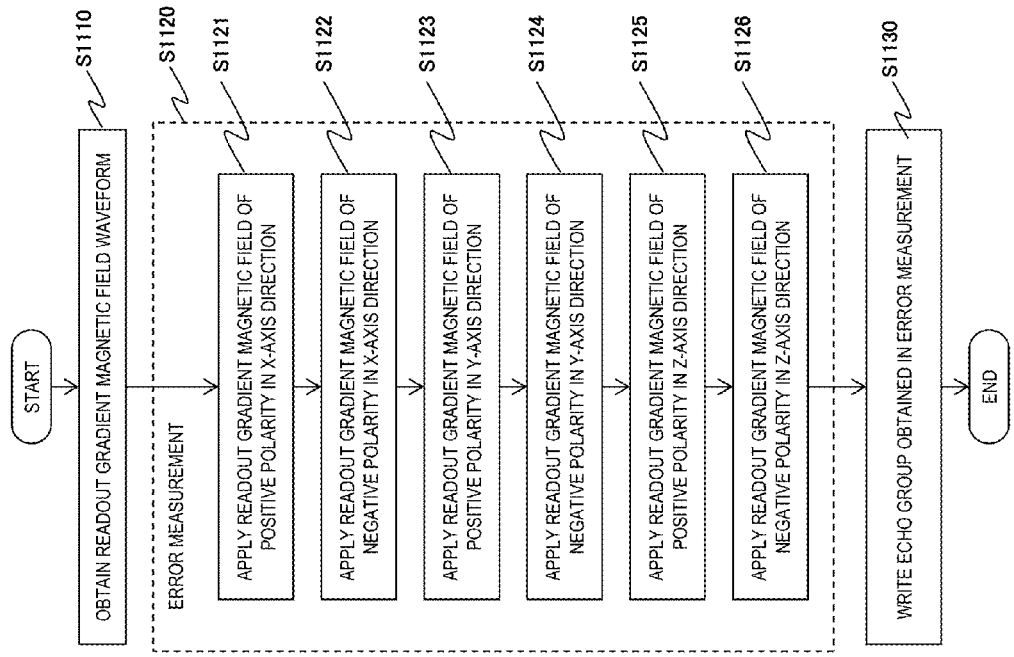
FIG. 5 is a flow chart of the echo measurement process of the first embodiment.

First, the error measurement process by the error measuring unit 201 will be described in detail along the process flow using the flow chart shown in FIG. 5. The present process starts according to the user's command.

First, the readout gradient magnetic field waveform 211 to be used in the image acquisition sequence is obtained from the storage device 172 (Step S1110).

Next, a command is provided to the sequencer 140 according to a sequence to obtain echo signals for error measurement (an error measurement sequence) in order to execute the error measurement (Step S1120). Next, in the present embodiment, as the error measurement, a sequence with positive-polarity readout gradient magnetic field pulse that obtains a positive-polarity echo signal by applying a readout gradient magnetic field pulse with the same pulse shape as the readout gradient magnetic field pulse to be used for the image acquisition sequence in a predetermined axis direction with the positive polarity and a sequence with a negative-polarity readout gradient magnetic field pulse that obtains a negative-polarity echo signal by applying the same pulse in the same axis direction with the negative polarity are executed by changing an application axis among the X, Y, and Z axes. When a slice-selective gradient magnetic field pulse is applied to an axis different from the application axis of the readout gradient magnetic field pulse, the polarity of slice-selective gradient magnetic field pulse becomes constant regardless of the polarity of the readout gradient magnetic field pulse. Also, the error measurement sequence is previously stored in the storage device 172.

Additionally, in the error measurement sequence, the number of applications and an application timing of the readout gradient magnetic field pulse are matched with those in the image acquisition sequence. For example, in a case where the image acquisition sequence is multi-echo measurement, the sequence with a positive-polarity readout gradient magnetic field pulse and the sequence with a negative-polarity readout gradient magnetic field pulse of the error measurement sequence respectively become the multi-echo measurement that has the same number of multi-echoes. Then, a pair of a positive-polarity echo signal and a negative-polarity echo signal with different TEs is obtained by the number of multi-echoes. Also, in a case where the reception coil 161 has multi-channels, a positive-polarity echo signal and a negative-polarity echo signal are obtained for each channel.

Figure 6:
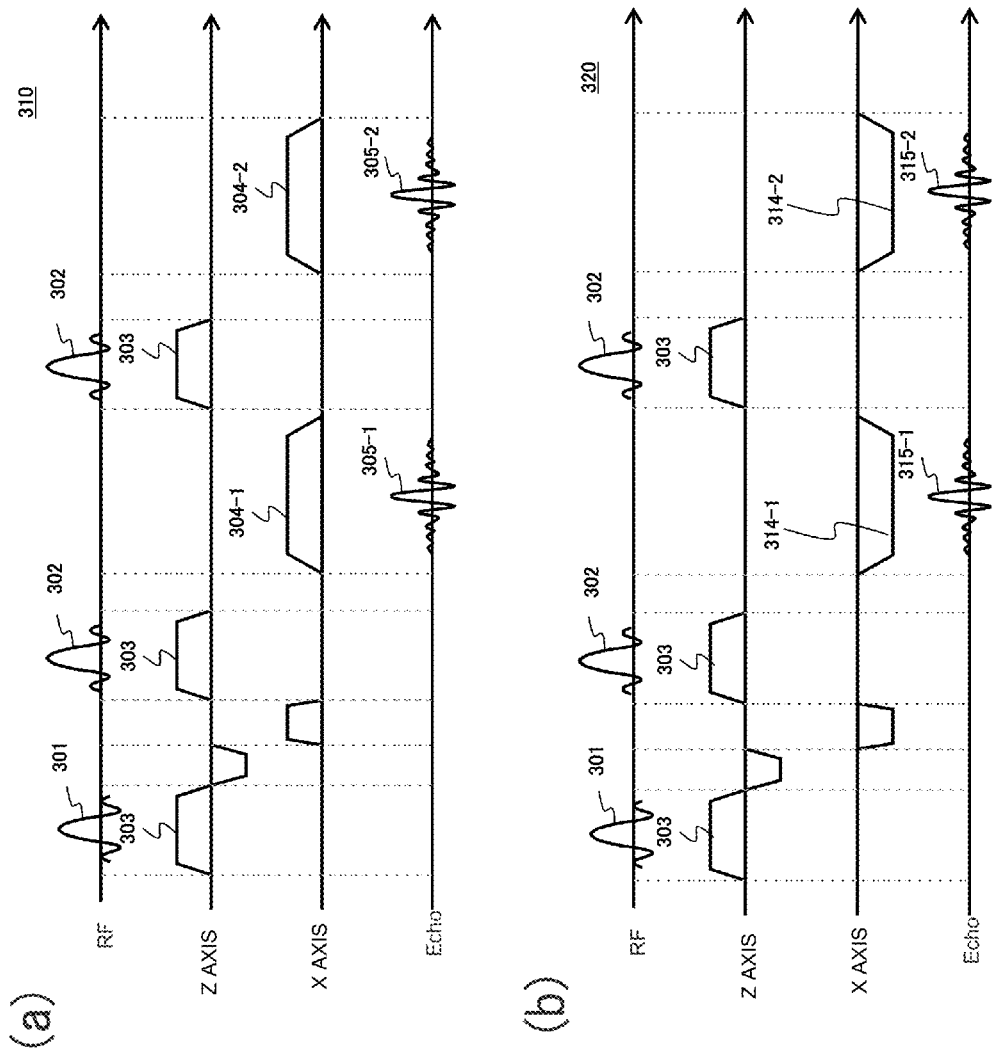
FIGS. 6(a) and 6(b) are explanatory diagrams for explaining the pulse patterns in the error measurement sequence of the first embodiment.

An example of the pulse pattern in the error measurement sequence to be executed here is shown in FIGS. 6(a) and 6(b). FIG. 6(a) is an example of the sequence 310 with a positive-polarity readout gradient magnetic field pulse, and FIG. 6(b) is an example of the sequence 320 with a negative-polarity readout gradient magnetic field pulse. In the multi-echo measurement whose number of multi-echoes is two in a spin echo sequence, a pulse pattern in case of applying a readout gradient magnetic field pulse in the X direction is shown here as an example. In the diagram, a crusher pulse and the like are omitted for simple explanation.

First, the slice-selective gradient magnetic field pulse 303 is applied to an axis (the Z axis in this case) different from the application axis of a readout gradient magnetic field pulse along with the RF pulse 301. Then, the RF pulse 302 is applied along with the slice-selective gradient magnetic field pulse 303. Here, the RF pulse 301 is a 90-degree pulse, the RF pulse 302 is a 180-degree pulse, and a shape of the slice-selective gradient magnetic field pulse 303 is the same as that of the image acquisition sequence.

Then, in the sequence 310 with a positive-polarity readout gradient magnetic field pulse, the positive-polarity echo signals 305-1 and 305-2 are obtained while the readout gradient magnetic field pulses 304-1 and 304-2 are respectively applied with the positive polarity. On the other hand, in the sequence 320 with a negative-polarity readout gradient magnetic field pulse, the negative-polarity echo signals 315-1 and 315-2 are obtained while the readout gradient magnetic field pulses 314-1 and 314-2 are respectively applied with the reverse (negative) polarity. Additionally, hereinafter, in a case where there is no need to particularly distinguish them, the readout gradient magnetic field pulse 304 (304-1, 304-2), the positive-polarity echo signal 305 (305-1, 305-2), the readout gradient magnetic field pulse 314 (314-1, 314-2), and the negative-polarity echo signal 315 (315-1, 315-2) represent them respectively.

Thus, the error measurement sequence of the present embodiment is comprised of the sequence 310 with a positive-polarity readout gradient magnetic field pulse that applies readout gradient magnetic field pulses with the same pulse shape as all the readout gradient magnetic field pulses to be used in the multi-echo measurement in the image acquisition sequence with the positive polarity in order to obtain positive-polarity echo signals respectively and the sequence 320 with a negative-polarity readout gradient magnetic field pulse that applies readout gradient magnetic field pulses with the same pulse shape as all the readout gradient magnetic field pulses to be used in the multi-echo measurement in the image acquisition sequence with the negative polarity in order to obtain negative-polarity echo signals respectively.

The error measuring unit 201 of the present embodiment executes the sequence 310 with a positive-polarity readout gradient magnetic field pulse and the sequence 320 with a negative-polarity readout gradient magnetic field pulse for each axis in order to obtain the positive-polarity echo signals and the negative-polarity echo signals in the error measurement process of Step S1120.

That is, the sequence 310 with a positive-polarity readout gradient magnetic field pulse in which the positive-polarity readout gradient magnetic field pulse 304 is applied in the X-axis direction is executed (Step S1121); the sequence 320 with a negative-polarity readout gradient magnetic field pulse in which the negative-polarity readout gradient magnetic field pulse 314 is applied in the X-axis direction is executed (Step S1122); the sequence 310 with a positive-polarity readout gradient magnetic field pulse in which the positive-polarity readout gradient magnetic field pulse 304 is applied in the Y-axis direction is executed (Step S1123); the sequence 320 with a negative-polarity readout gradient magnetic field pulse in which the negative-polarity readout gradient magnetic field pulse 314 is applied in the Y-axis direction is executed (Step S1124); the sequence 310 with a positive-polarity readout gradient magnetic field pulse in which the positive-polarity readout gradient magnetic field pulse 304 is applied in the Z-axis direction is executed (Step S1125); and the sequence 320 with a negative-polarity readout gradient magnetic field pulse in which the negative-polarity readout gradient magnetic field pulse 314 is applied in the Z-axis direction is executed (Step S1126).

Additionally, the slice-selective gradient magnetic field pulse 303 should be applied in an axis direction different from the application direction of the readout gradient magnetic field pulse 304. Although FIGS. 6(a) and 6(b) show a case of applying the pulse in the Z-axis direction as an example, the pulse may be applied in the Y-axis direction. Similarly, when the readout gradient magnetic field pulse 304 is applied in the other axis direction, the slice-selective gradient magnetic field pulse 303 is applied in an axis direction other than the said axis.

Also, although FIGS. 6(a) and 6(b) show a case where a pulse sequence to be the base of the error measurement sequence is set as a spin echo sequence, this is similar also in the case of a gradient echo sequence or a high-speed spin echo sequence. That is, the same readout gradient magnetic field pulse as that in the image acquisition sequence should be applied to an axis for which an error is measured, and the same slice-selective gradient magnetic field pulse as that in the image acquisition sequence should be applied to the other axis.

Then, the error measuring unit 201 writes an echo signal group obtained in the error measurement process of Step S1120 as the error measurement echo group 212 in the storage device 172 (Step S1130). Additionally, the error measurement echo group 212 is comprised of positive-polarity echo signals and negative-polarity echo signals for each axis, for each echo in case of multi-echo measurement, and for each channel in case of multi-channels.

<Shift Amount Calculation Method>

Figure 7:
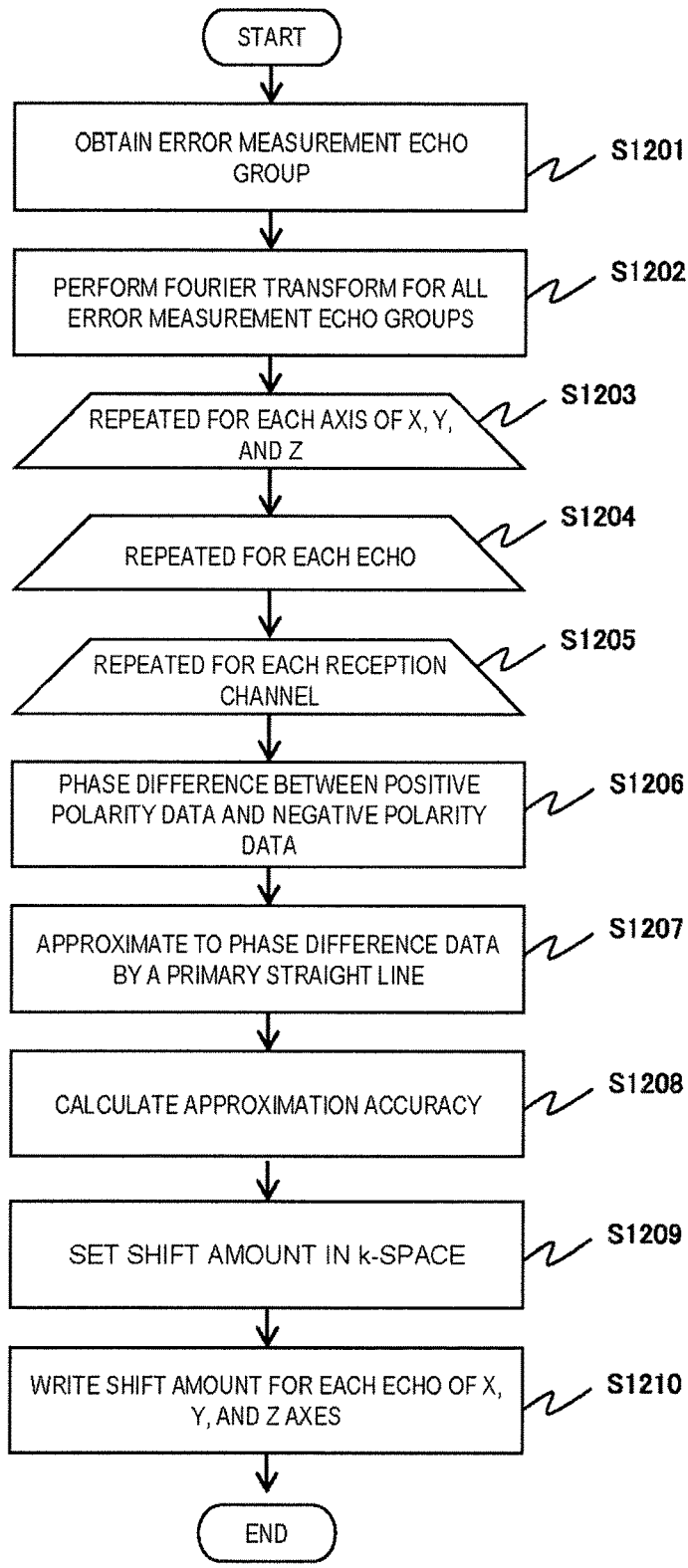
FIG. 7 is a flow chart of the shift amount calculation process of the first embodiment.

Next, a shift amount calculation method by the shift amount calculation unit 202 will be described using the flow chart shown in FIG. 7.

In the present embodiment, the shift amount is obtained from a phase difference between positive-polarity data acquired by performing the Fourier transform for the positive-polarity echo signals and negative-polarity data acquired by performing the Fourier transform for the negative-polarity echo signals. At this time, the shift amount is calculated based on a first-order gradient of the phase difference. In a case where the reception coil 161 is multi-channel, a shift amount calculated for each channel is set as a shift amount candidate, a calculation accuracy of the shift amount candidate is additionally calculated, and a shift amount candidate of a channel with the highest calculation accuracy is set as a shift amount. Additionally, in case of multi-echo measurement, shift amounts of multiple positive- and negative-polarity echo signals with different TEs are calculated for the respective TEs.

First, the recorded error measurement echo groups 212 are read from the storage device 172 (Step S1201). At this time, in a case where the error measurement sequence is a high-speed spin echo sequence, when there are echo signals other than zero phase encoding, these echo signals may be deleted.

Next, the Fourier transform is performed for all the read error measurement echo groups 212 in the frequency encoding direction (the readout encoding direction) (Step S1202).

Next, in the repeating loop S1203, the process of the repeating loop S1204 is repeated for each of the X, Y, and Z axes. Also, in the repeating loop S1204, the process of the repeating loop S1205, Step S1209, and Step S1210 are repeated for each echo in multi-echo. Also, in the repeating loop S1205, the processes from S1206 to S1208 are repeated by the number of reception channels.

Then, from among the echo signals for which the Fourier transform was performed in Step S1202, positive-polarity data and negative-polarity data respectively acquired from positive-polarity echo signals and negative-polarity echo signals of an axis to be currently processed are extracted to calculate a phase difference of both the data (complex phase-difference data) (Step S1206).

In a case where the positive-polarity data is $\Delta D^+(i)$ and the negative-polarity data is $\Delta D^-(i)$, the complex phase-difference data $\Delta D(i)$ is calculated using the following formula (1).

[No. 1]

$$\Delta D(i) = D^+(i) \cdot \overline{D^-}(i) / |D^-(i)| \qquad (1)$$
$$= \frac{(D_R^+(i) + jD_I^+(i))(D_R^-(i) - jD_I^-(i))}{\sqrt{D_R^-(i)^2 + D_I^-(i)^2}}$$

A phase $\Delta\varphi(i)$ of phase-difference data of a scalar value is calculated in the following formula (2).

[No. 2]

$$\Delta\Phi(i) = \Delta\Phi(i-1) + \frac{(\Delta D_R(i) + j\Delta D_I(i))(\Delta D_R(i-1) - j\Delta D_I(i-1))}{\sqrt{\Delta D_R(i-1)^2 + \Delta D_I(i-1)^2}} \qquad (2)$$

In the above formula, $\Delta D_R(i)$ and $\Delta D_I(i)$ respectively represent a real part and an imaginary part of the complex phase-difference data $\Delta D(i)$.

The following is the reason to obtain a phase difference between data acquired from positive-polarity echo signals and negative-polarity echo signals. When $\Delta P_R(i)$ is a phase error component due to an area error of a readout gradient magnetic field pulse; $\Delta P_{B0}(i)$ is a phase error component due to an offset of a gradient magnetic field pulse; and $\Delta P_C(i)$ is a phase error component due to phase distribution of the reception coil 161, a phase profile $\varphi^+(i)$ in image space of an echo signal measured by applying a positive-polarity readout gradient magnetic field pulse and a phase profile $\varphi^-(i)$ in image space of an echo signal measured by applying a negative-polarity readout gradient magnetic field pulse are represented in the following formula (3).

[No. 3]

$$\begin{cases} \Phi^+(i) = \Delta P_R(i) + \Delta P_{B0}(i) + \Delta P_C(i) \\ \Phi^-(i) = -\Delta P_R(i) + \Delta P_{B0}(i) + \Delta P_C(i) \end{cases} \qquad (3)$$

In the above formula, "i" is a data point number in image space in which the Fourier transform was performed for a measured echo signal in the frequency encoding direction.

Additionally, $\Delta P_R(i)$ and $\Delta P_{B0}(i)$ in the formula (3) have different values for each echo in multi-echo. Also, $\Delta P_{B0}(i)$ in the formula (3) has different values for each axis because influence varies depending on the measurement axis direction. Also, $\Delta P_C(i)$ in the formula (3) has different values for each channel of the reception coil 161. Therefore, $\varphi^+(i)$ and $\varphi^-(i)$ have different values for each of the echoes in multi-echo, the axes, and the reception channels.

By obtaining a difference from the two equations of the formula (3), only a phase error component $\Delta P_R(i)$ due to an application area error of a readout gradient magnetic field pulse that is a dynamic error can be extracted. $\Delta P_R(i)$ is represented in the following formula (4).

[No. 4]

$$\Delta P_R(i) = \frac{\Phi^+(i) - \Phi^-(i)}{2} \quad (4)$$

Therefore, there is no misalignment caused in a positional relationship between blades in case of correcting a position in k-space of each blade using the $\Delta P_R(i)$. Additionally, because phase error components of $\Delta P_{B0}(i)$ and $\Delta P_C(i)$ are static errors and are common to all the blades, there is no misalignment caused in a positional relationship between blades even without correction.

Next, in order to calculate a first-order gradient of $\Delta P_R(i)$, a first-order straight line is fitted to the phase difference results (Step S1207). This is because a phase difference in image space corresponds to a shift amount of an echo signal in k-space. The least squares method is used for application processing. That is, a first-order straight line to be applied is represented in the following formula (5), and first-order coefficients $a_1$ and zero-order coefficients $a_0$ in the said formula are calculated from the following formula (6).

[No. 5]

$$\Delta \Phi'(i) = a_i \cdot i + a_0 \quad (5)$$

$$\begin{cases} a_1 = \dfrac{N\sum\limits_{i=1}^{N} i \cdot \Delta\Phi(i) - \sum\limits_{i=1}^{N} i \sum\limits_{i=1}^{N} \Delta\Phi(i)}{N\sum\limits_{i=1}^{N} i^2 - \left(\sum\limits_{i=1}^{N} i\right)^2} \\ a_0 = \dfrac{\sum\limits_{i=1}^{N} i^2 \sum\limits_{i=1}^{N} \Delta\Phi(i) - \sum\limits_{i=1}^{N} i \cdot \Delta\Phi(i) \sum\limits_{i=1}^{N} i}{N\sum\limits_{i=1}^{N} i^2 - \left(\sum\limits_{i=1}^{N} i\right)^2} \end{cases} \quad (6)$$

In the above formula, "N" is the number of data points of phase difference data.

Additionally, in the application of a first-order straight line, an effective data range may be determined using absolute value information in order to ignore a noise region. Also, the noise influence may be reduced using the corrected Thompson method or the like.

Next, an application accuracy of a first-order straight line applied in Step S1207 is calculated for each channel of the reception coil 161 (Step S1208).

an application accuracy R(ch) of a first-order straight line for each channel of the reception coil 161 is calculated in the following formulas (7) and (8).

[No. 6]

$$R(ch) = \sqrt{\frac{N\sum\limits_{i=1}^{N} \delta\Phi(i)^2 - \left(\sum\limits_{i=1}^{N} \delta\Phi(i)\right)^2}{N(N-1)}} \quad (7)$$

$$\delta\Phi(i) = \Delta\Phi(i) - \Delta\Phi'(i) \quad (8)$$

In the above formula, "ch" represents a channel number of the reception coil 161.

After finishing the process until Step S1208 and passing through the repeating loop S1205, a shift amount in k-space is set (Step S1209). In the shift amount setting, a first-order coefficient $a_1$ of a channel number with the highest application accuracy R(ch) of the first-order straight line calculated in Step S1208 is selected from among the first-order coefficients $a_1$ calculated in Step S1207 in order to convert the first-order coefficient $a_1$ into a shift amount d in k-space according to the formula (9).

[No. 7]

$$d = -a_1 \times \frac{N}{2\pi} \times \frac{1}{2} \quad (9)$$

Then, values set as shift amounts in Step S1209 are recorded in the storage device 172 by separating them into each axis and each echo in multi-echo (Step S1210).

<k-Space Coordinate Calculation Process>

Figure 8:
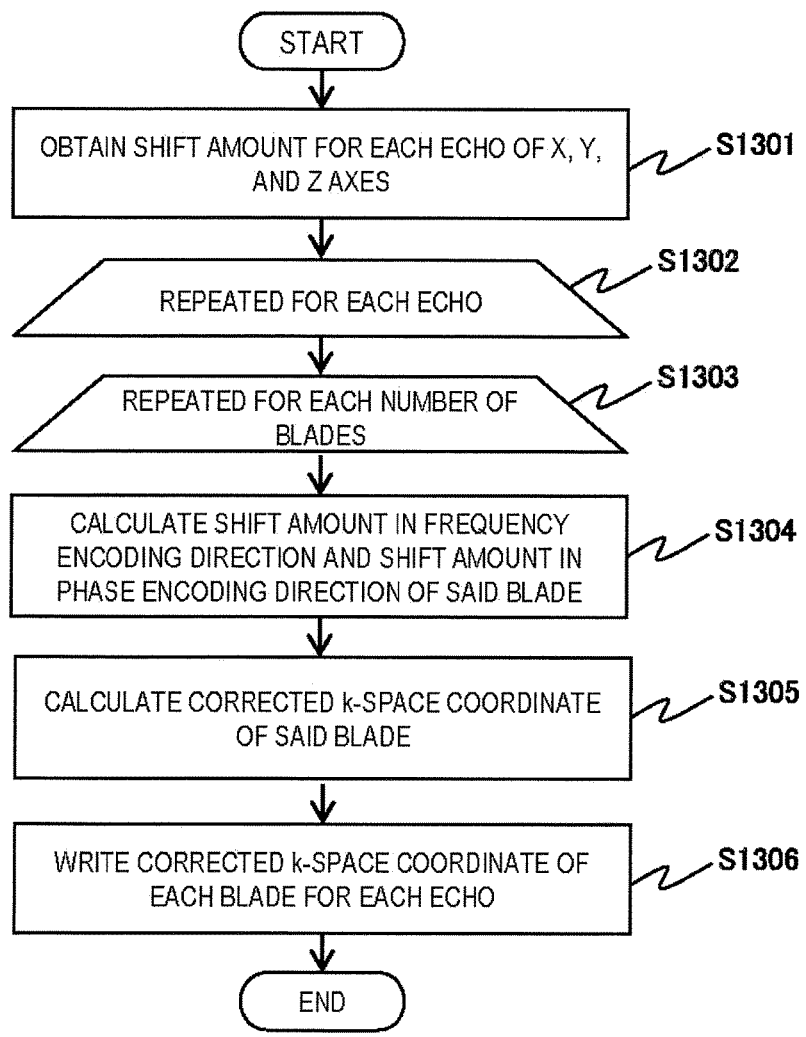
FIG. 8 is a flow chart of the k-space coordinate calculation process of the first embodiment.

Next, a k-space coordinate calculation process by the k-space coordinate calculation unit 203 will be described using the flow chart shown in FIG. 8. As described above, the k-space coordinate calculation unit 203 reflects the X-, Y-, and Z-axis shift amounts 213 calculated by the shift amount calculation unit 213 in order to calculate the corrected k-space coordinate 214 in non-orthogonal system k-space of measurement data in main imaging. The corrected k-space coordinate 214 is obtained by converting the X-, Y-, and Z-axis shift amounts 213 into a shift amount in the frequency encoding direction and a shift amount in the phase encoding direction for each blade and adding the shift amounts to a k-space coordinate of measurement data acquired in an image acquisition sequence. In case of multi-echo measurement, the corrected k-space coordinate 214 is calculated for each echo.

First, in Step S1301, the shift amount calculation unit 202 reads out the shift amount 213 of each echo in multi-echo for each axis of X, Y, and Z after recording the shift amount in the shift amount calculation process (Step S1301).

Next, in the repeating loop S1302, the process in the repeating loop S1303 is repeated for each echo in multi-echo. Then, the processes in Steps S1304 and S1305 are performed for each blade in the repeating loop S1303.

Shift amounts in each of the X-, Y-, and Z-axis directions are converted into a shift amount df in the frequency encoding direction and a shift amount dp in the phase encoding direction in each blade (Step S1304). The shift amounts df and dp are calculated in the following formula (10).

[No. 8]

$$\begin{bmatrix} ds(\theta(bl)) \\ dp(\theta(bl)) \\ df(\theta(bl)) \end{bmatrix} = R_{OM}^T \begin{bmatrix} 1 & 0 & 0 \\ 0 & \cos(\theta(bl)) & \sin(\theta(bl)) \\ 0 & -\sin(\theta(bl)) & \cos(\theta(bl)) \end{bmatrix} \begin{bmatrix} dx \\ dy \\ dz \end{bmatrix} \quad (10)$$

In the above formula, $R_{OM}$ is an oblique matrix for converting a measurement coordinate system (a slice, a phase, and a frequency encoding direction) into a device coordinate system (the X, Y, and Z axes). Here, in order to convert the shift amounts dx, dy, and dz calculated for each axis of the device coordinate system into the measurement coordinate system using the formula (9), an inverse matrix of the oblique matrix is multiplied. Additionally, the oblique matrix is a rotation matrix, and the inverse matrix is equal to a transposed matrix. Also, "bl" is a blade number, and "Θ(bl)" is an angle of the bl-th blade.

Next, using the calculated shift amounts df and dp of each blade, the corrected k-space coordinate 214 of the said blade is calculated (Step S1305). At this time, a corrected k-space coordinate (F, P) is in accordance with the following formulas (11) and (12).

[No. 9]

$$\begin{cases} F(bl, e, n) = \cos(\theta(bl)) \times \left(n - \dfrac{DataPoints}{2}\right) + X_o(e, bl) + df(\theta(bl)) \\ P(bl, e, n) = \sin(\theta(bl)) \times \left(n - \dfrac{DataPoints}{2}\right) + Y_o(e, bl) + dp(\theta(bl)) \end{cases} \quad (11)$$

$$\begin{cases} X_o(e, bl) = p \times 2 \times \sin(\theta(bl)) \\ Y_o(e, bl) = p \times 2 \times \cos(\theta(bl)) \end{cases} \quad (12)$$

In the above formula, the following are the meanings of the respective symbols to be used in the formulas (11) and (12).

n: a frequency encoding direction coordinate value in a blade [data point number]

e: a phase encoding direction coordinate value in a blade [data point number]

bl: a blade number [-]

DataPoints: the number of data points of an echo signal [data point number]

p: a phase encoding number

Θ(bl): an angle of the bl-th blade [rad]

df(Θ(bl)): a shift amount in the frequency encoding direction in a measurement coordinate system of the bl-th blade [pixels]

dp(Θ(bl)): a shift amount in the phase encoding direction in a measurement coordinate system of the bl-th blade [pixels]

Lastly, a corrected k-space coordinate calculated for each echo and each blade in Step S1306 is recorded in the storage device 172.

<Measurement Process Flow>

Figure 9:
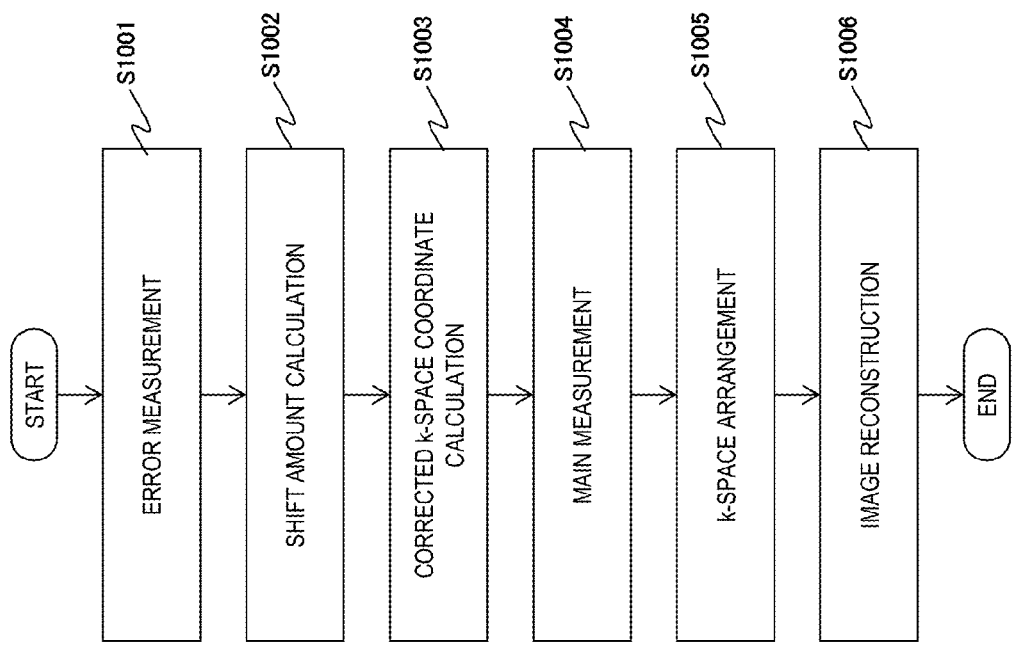
FIG. 9 is a flow chart of the measurement process of the first embodiment.

Lastly, the measurement process flow of the present embodiment by each device of the control processing system 170 of the present embodiment is shown in FIG. 9.

The error measuring unit 201 reads out the readout gradient magnetic field waveform 211 and performs an error measurement process in which a gradient magnetic field pulse having the same pulse waveform as a readout gradient magnetic field pulse to be used in an image acquisition sequence is applied with the positive polarity to obtain a positive-polarity echo signal and is applied with the negative polarity to obtain a negative-polarity echo signal (Step S1001). These of the positive-polarity echo signal and the negative-polarity echo signal are obtained for the X, Y, and Z axes respectively and are stored in the storage device 172 as the error measurement echo group 212.

The shift amount calculation unit 202 calculates shift amounts different for the respective blades from among shift amounts of the echo signals as the X-, Y-, and Z-axis shift amounts 213 using the positive-polarity echo signal and the negative-polarity echo signal to be stored as the error measurement echo group 212 (Step S1002). In the above calculation, the shift amounts are calculated for each of the X, Y, and Z axes and stored as the X-, Y-, and Z-axis shift amounts 213 in the storage device 172.

The k-space coordinate calculation unit 203 reflects a shift amount to calculate a corrected k-space coordinate of measurement data acquired from an echo signal to be measured in an image acquisition sequence (Step S1003).

The image measuring unit 205 executes an image acquisition sequence using the radial sampling method (Step S1004) and acquires measurement data to arrange it in k-space (Step S1005).

The reconstruction unit 204 uses the corrected k-space coordinate as a k-space coordinate to reconstruct an image from the measurement data (Step S1006).

Hereinafter, an effect example of the present embodiment is shown in FIGS. 10 and 11. FIGS. 10(*a*) and 10(*b*) are images imaged using a spin echo sequence and a local RF reception coil. FIG. 10(*a*) is the image 411 acquired using a conventional method. Here, a shift amount is calculated from phase distribution of echo signals obtained by applying a readout gradient magnetic field pulse of a single polarity, and the calculated shift amount is reflected to perform the reconstruction process. FIG. 10(*b*) is the image 412 acquired using the method of the present embodiment. It is found that the artifacts indicated by the arrow in FIG. 10(*a*) are reduced in FIG. 10(*b*).

FIGS. 11(*a*) and 11(*b*) are the image 421 and the image 422 imaged in a gradient echo sequence subject to influence of static magnetic field inhomogeneity. FIG. 11(*a*) is the image 421 acquired using a conventional method similarly to FIG. 10(*a*). FIG. 11(*b*) is the image 422 acquired using the method of the present embodiment. In FIG. 11(*b*), it is found that uneven brightness is reduced in the image compared to FIG. 11(*a*) and the high quality image is acquired.

As described above, the MRI apparatus 100 of the present embodiment comprises the image measuring unit 205 that controls an application of a readout gradient magnetic field pulse according to the pulse sequence of a radial sampling method and executes an image acquisition sequence for measuring an echo signal for image reconstruction in order to acquire measurement data; the shift amount calculation unit 202 that separates a plurality of factors shifting a position of the echo signal in k-space in order to calculate a shift amount for each blade; the k-space coordinate calculation unit 203 that reflects the calculated shift amount and corrects a coordinate of the measurement data in non-orthogonal coordinate system k-space in order to calculate a corrected k-space coordinate; and the reconstruction unit 204 that rearranges the measurement data in the orthogonal coordinate system k-space based on the corrected k-space coordinate in order to reconstruct an image.

Then, the shift amount calculation unit 202 may calculate the shift amount from positive-polarity and negative-polarity echo signals obtained by applying a readout gradient magnetic field pulse having the same pulse shape as a readout gradient magnetic field pulse to be used in the image acquisition sequence with the respective positive and negative polarities. Also, the shift amount calculation unit 202 may calculate the shift amount for each axis of X, Y, and Z of the said magnetic resonance imaging apparatus 100, and the k-space coordinate calculation unit 203 may obtain the corrected k-space coordinate by calculating a shift amount in the frequency encoding direction for each of the blades from the shift amount for each axis and adding a shift amount in the frequency encoding direction corresponding to the k-space coordinate of the measurement data acquired in the image acquisition sequence.

Also, the error measuring unit 201 that executes an error measurement sequence for obtaining the positive-polarity and negative-polarity echo signals is further included, the pulse sequence to be used in the image acquisition sequence is a multi-echo measurement sequence for obtaining a plurality of echo signals after one application of an excitation pulse, the error measurement sequence is comprised of a sequence with a positive-polarity readout gradient magnetic field pulse and a sequence with a negative-polarity readout gradient magnetic field pulse that apply readout gradient magnetic field pulses having the same pulse shape as all the readout gradient magnetic field pulses to be used in the multi-echo measurement sequence respectively with the positive and negative polarities in order to obtain the positive-polarity and negative-polarity echo signals respectively, and the shift amount calculation unit 202 may calculate a shift amount for each pair of the positive-polarity and negative-polarity echo signals having the same echo time.

Thus, in the present embodiment, as a measurement separate from the image acquisition sequence, sequences to obtain the positive-polarity and negative-polarity echo signals are executed by applying readout gradient magnetic field pulses having the same shape of the readout gradient magnetic field pulse as the image acquisition sequence for each axis of X, Y, and Z of the MRI apparatus 100 with the positive and negative polarities respectively. Then, a phase difference is performed for each axis of X, Y, and Z after the Fourier transform is performed for the positive-polarity and negative-polarity echo signals, and a first-order straight line is fitted to the phase difference results to calculate a shift amount for each axis of X, Y, and Z of echo signals in k-space. The calculated shift amounts of each axis of X, Y, and Z are allocated to a measurement plane (i.e. the shift amounts in the frequency encoding direction and the phase encoding direction for each blade are obtained) according to an angle of each blade in an image acquisition sequence (i.e. according to a gradient magnetic field intensity of each axis to be applied in each blade). Then, the shift amounts allocated to the measurement plane are added to coordinates to arrange the respective echo signals in the k-space in the image acquisition sequence. Hence, a shift amount due to a static error is excluded, and only a shift amount due to a dynamic error is corrected in the present embodiment.

As described above, because static and dynamic errors cannot be separated in the method shown in PTL 1 that calculates shift amounts from phase distribution of the echo signals obtained from a single-polarity readout gradient magnetic field, a correction degree of the static error varies depending on the blade, which cannot properly correct a positional relationship between blades. On the contrary to this, the present embodiment separates the static and dynamic errors in order to correct only a dynamic error, which can remove misalignment of the positional relationship between the blades.

Also, while an echo signal needs to have a shape with a single peak in the method similarly shown in PTL 1, the present embodiment calculates a shift amount from a phase difference between two echo signals obtained by changing a polarity of a readout gradient magnetic field pulse, which can calculate the shift amount properly whatever the echo signal shape is. Therefore, an appropriate shift amount can be calculated even in case of a gradient echo sequence subject to influence of static magnetic field inhomogeneity or performing measurement using the reception coil 161 with local sensitivity distribution.

Also, although an assumption that an echo signal shape does not change over time is required for the method that uses time variation of a peak position of the echo signal, the present embodiment does not require the assumption because static and dynamic errors are separated and calculated from a phase difference between two echo signals obtained by changing a polarity of a readout gradient magnetic field pulse.

As described above, the present embodiment can reduce an error of the positional relationship between blades, arrange the blades in k-space appropriately, and prevent artifacts and uneven brightness in any of cases: 1) a case where dynamic and static errors coexist; 2) a case where imaging is performed using the reception coil 161 with local sensitivity distribution; and 3) a case of using a pulse sequence subject to static magnetic field inhomogeneity such as a gradient echo sequence. Therefore, a satisfactory image using the radial scan method can be acquired.

Second Embodiment

Next, the second embodiment to which the present invention is applied will be described. Although the first embodiment calculates shift amounts and corrected k-space coordinates for all the echoes in case of multi-echo measurement, the present embodiment calculates shift amounts and corrected k-space coordinates for minimally-required echoes to reduce an error measurement time in the multi-echo measurement.

In the present embodiment, the shift amount calculation is limited to once for echo signals whose shift amounts are almost the same in k-space during multi-echo measurement. This is particularly effective in the multi-echo measurement that has a number of echoes and is performed to visualize T2 and T2* values to be imaged.

The MRI apparatus of the present embodiment basically has a similar configuration to the MRI apparatus 100 of the first embodiment. Also, the overall imaging process flow is similar to the first embodiment. However, the configuration of the error measuring unit 201 is different because the number of echoes to be used for shift amount calculation is limited. Hereinafter, the present embodiment will be described by focusing on the configuration different from the first embodiment.

The error measuring unit 201 of the present embodiment obtains the readout gradient magnetic field waveform 211 in an error measurement control process, removes an unnecessary multi-echo measurement portion, and then generates an error measurement sequence. The unnecessary multi-echo measurement portion is a portion to obtain echo signals whose shift amounts are almost the same in k-space.

An eddy current causes an application area error of a gradient magnetic field and shifts echo signals. For example, shift amounts of echo signals in k-space are also the same for echo signals whose influence of the eddy current is the same in multi-echo measurement. Therefore, the present embodiment determines whether or not the shift amounts are the same according to whether or not the influence due to the eddy current is the same. For example, the determination is performed using a time constant of a residual eddy current.

Figure 12:
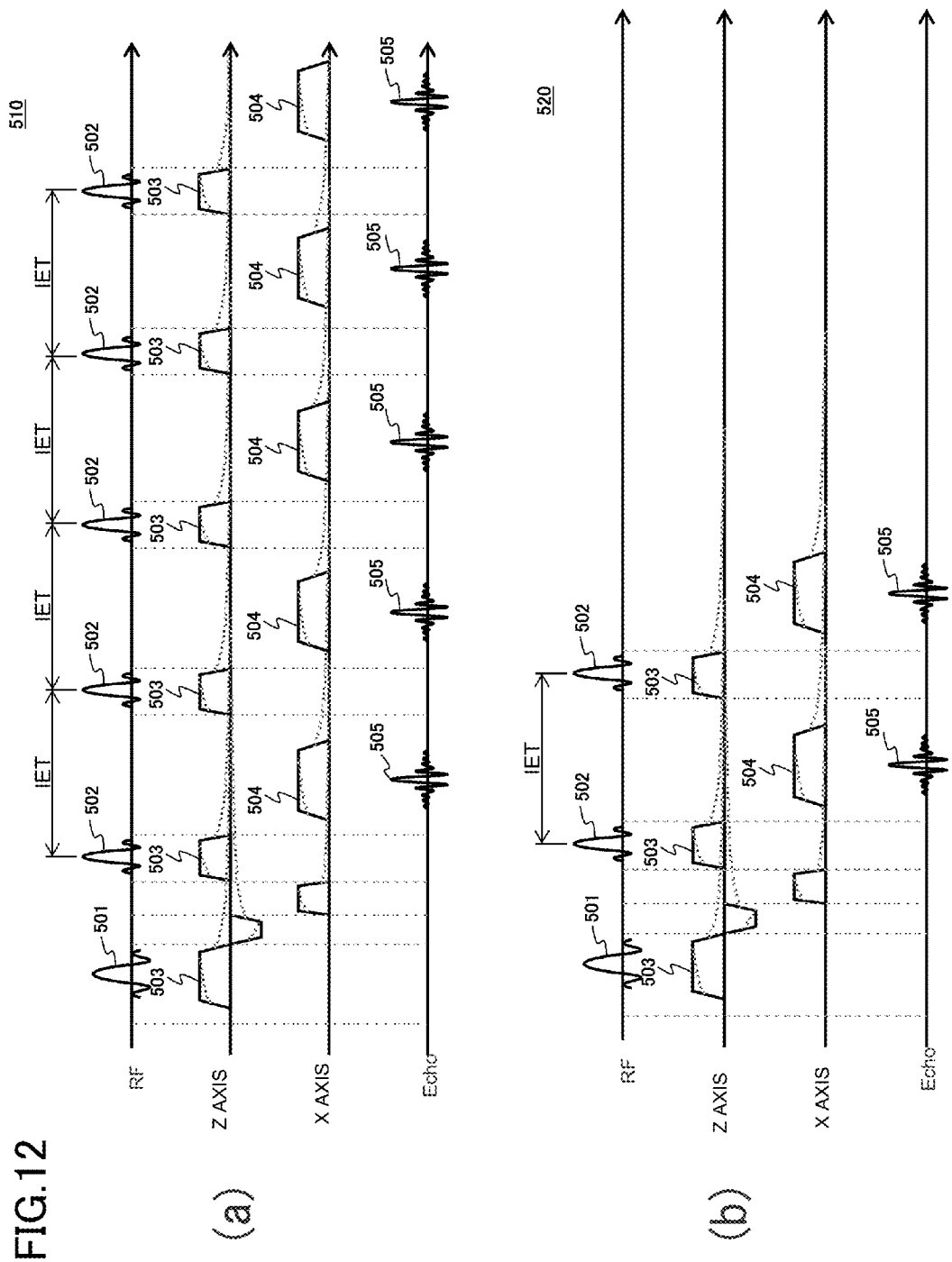
FIG. 12(a) is an explanatory diagram for explaining the pulse pattern to be used in the image acquisition sequence of the second embodiment.
FIG. 12(b) is an explanatory diagram for explaining the pulse pattern to be used for error measurement.

FIG. 12(*a*) shows the pulse sequence 510 of multi-echo measurement to be used for an image acquisition sequence. Here, a case of applying the slice-selective gradient magnetic field pulse 503 in the Z direction and the readout gradient magnetic field pulse 504 in the X direction is shown as an example. Also, the broken lines show the appearance of eddy currents.

The degree of the eddy current influence can be determined from the time constant. Here, the eddy current is expressed using an exponential function as shown in the following formula (13).

[No. 10]

$$EddyCurrent(t) = \alpha \cdot \exp\left(-\frac{t}{\tau}\right) \quad (13)$$

Here, "EddyCurrent(t)" is a function of an eddy current, "α" is an amplitude gain of the eddy current, and "τ" is a time constant of the eddy current.

For example, a criterion to which the influence can be ignored if an eddy current amplitude is equal to or less than 1% may be provided. The required time to be equal to or less than 1% is five times as much as the time constant "τ".

In case of providing such a criterion, the minimum echo number n ("n" is an integer equal to or more than 1) at which influence of an eddy current is equal can be calculated in the following formula (14).

[No. 11]

$$n = \text{Round\_up}\left(\frac{5\tau}{IET}\right) + 1 \quad (14)$$

In the above formula, "Round_up( )" is a function that rounds up digits after the decimal point to be an integer, and "IET" is an echo time interval in a pulse sequence. Additionally, a known value is used for "τ", for example, a shortest eddy current time constant assured by an MRI apparatus may be used.

FIG. 12(a) shows a case where an eddy current time constant is equal to or less than one-fifth of IET, i.e. n=2. In the present example, it can be thought that echo signals after the echo number 2 are affected by the same eddy current. Therefore, the number of multi-echoes required to be measured in error measurement is equal to or less than 2.

The error measuring unit 201 of the present embodiment sets the basic sequence 520 of an error measurement sequence by omitting pulses after obtaining the required number of echoes in the pulse sequence as shown in FIG. 12(b). Then, a readout gradient magnetic field pulse of the basic sequence is applied with the positive polarity in order to execute a sequence with a positive-polarity readout gradient magnetic field pulse that obtains positive-polarity echo signals and with the negative polarity in order to execute a sequence with a negative-polarity readout gradient magnetic field pulse that obtains negative-polarity echo signals as the error measurement sequence.

That is, the error measurement sequence of the present embodiment is comprised of the sequence with a positive-polarity readout gradient magnetic field pulse that applies readout gradient magnetic field pulses with the same pulse shape as the said readout gradient magnetic field pulses respectively for readout gradient magnetic field pulses with a different pulse shape from among readout gradient magnetic field pulses to be used in the multi-echo measurement in the image acquisition sequence with the positive polarity in order to obtain positive-polarity echo signals respectively and the sequence with a negative-polarity readout gradient magnetic field pulse that respectively applies readout gradient magnetic field pulses applied in the sequence with a positive-polarity readout gradient magnetic field pulse with the negative polarity in order to obtain negative-polarity echo signals respectively.

The error measuring unit 201 of the present embodiment determines an error measurement sequence to be executed using the above method in prior to executing the error measurement sequence. Then, using the determined error measurement sequence, the error measurement echo group 212 is obtained and stored in the storage device 172 similarly to the first embodiment. At this time, the storage is performed by corresponding to the number of multi-echo in the present embodiment.

In the subsequent shift amount calculation process by the shift amount calculation unit 202, the process flow is basically similar to the first embodiment. However, a shift amount is calculated only from the obtained positive-polarity and negative-polarity echo signals. Also in the present embodiment, the shift amount is calculated for each TE (time of echo) that is different between a plurality of the positive-polarity and negative-polarity echo signals. Therefore, the number of repeating the repeating loop S1204 is not the number of multi-echoes of multi-echo measurement but "n" calculated by the error measuring unit 201 in the above formula (14). Then, the result is stored by corresponding to the number of multi-echo.

Also in the subsequent k-space coordinate calculation process by the k-space coordinate calculation unit 203, a corrected k-space coordinate is calculated only from the calculated shift amount. Therefore, the number of repeating the repeating loop S1302 is set to "n" calculated in the above formula (14) and executed. Then, the result is stored by corresponding to the number of multi-echo.

In a reconstruction process in the reconstruction unit 204, reconstruction is performed for measurement data of the number of multi-echo for which a corrected k-space coordinate has not been calculated using a corrected k-space coordinate of the number of multi-echo in which influence of an eddy current on a readout gradient magnetic field pulse to be applied is the same. Additionally, the measurement data of the number of multi-echo for which a corrected k-space coordinate has not been calculated is a multi-echo signal for which a corrected k-space coordinate is not stored by corresponding to the readout gradient magnetic field pulse to be applied when obtaining the said multi-echo signal. In the above example, the corrected k-space coordinate 214 generated using a shift amount of an n-th multi-echo is used in case of processing measurement data obtained from an echo signal of which the number of multi-echo exceeds "n".

As described above, the MRI apparatus 100 of the present embodiment is comprised of the image measuring unit 205 that executes an image acquisition sequence, the shift amount calculation unit 202, the k-space coordinate calculation unit 203, the reconstruction unit 204, and the error measuring unit 201 that executes an error measurement process similarly to the first embodiment. Additionally, a pulse sequence to be used for an image acquisition sequence is a multi-echo measurement sequence for obtaining a plurality of echo signals after applying an excitation pulse once, and the error measurement sequence is comprised of the sequence with a positive-polarity readout gradient magnetic field pulse that applies readout gradient magnetic field pulses with the same pulse shape as the said readout gradient magnetic field pulses respectively for readout gradient magnetic field pulses with a different pulse shape from among readout gradient magnetic field pulses to be used in the multi-echo measurement sequence with the positive polarity in order to obtain the positive-polarity echo signals respectively and the sequence with a negative-polarity readout gradient magnetic field pulse that respectively applies readout gradient magnetic field pulses applied in the sequence with a positive-polarity readout gradient magnetic field pulse with the negative polarity in order to obtain the negative-polarity echo signals respectively. At this time, the error measuring unit 201 may set a readout gradient magnetic field pulse in which influence of an eddy current is the same to the readout gradient magnetic field pulse with the same pulse shape.

Also, the shift amount calculation unit 202 may calculate the shift amount of each TE for a plurality of positive-polarity and negative-polarity echo signals of which TEs are different using the obtained positive-polarity and negative-polarity echo signals, the k-space coordinate calculation unit 203 may calculate the corrected k-space coordinate from the calculated shift amount, and the reconstruction unit 204 may perform the reconstruction for measurement data that is to be obtained in the image acquisition sequence and obtained by applying a readout gradient magnetic field pulse of an image acquisition sequence in which the corrected k-space coordinate has not been calculated, using the corrected k-space coordinate calculated from the positive-polarity and negative-polarity echo signals obtained by applying a readout gradient magnetic field pulse with the same pulse shape as the said readout gradient magnetic field pulse.

Thus, according to the present embodiment, a corrected k-space coordinate for which only a shift amount causing a positional error of a blade was corrected is obtained and used in order to reconstruct an image of an image acquisition sequence using positive-polarity and negative-polarity echo signals obtained by applying a readout gradient magnetic field pulse with the same readout gradient magnetic field pulse shape as the image acquisition sequence respectively with the positive polarity and the negative polarity, similarly to the first embodiment.

Therefore, similarly to the first embodiment, misalignment in the positional relationship between blades can be removed by separating static and dynamic errors correcting the dynamic error only. Also, similarly to the first embodiment, an appropriate shift amount can be calculated regardless of how the echo signal shape change even in a case of measurement using a gradient echo sequence subject to influence of static magnetic field inhomogeneity or the reception coil 161 with local sensitivity distribution.

Therefore, similarly to the first embodiment, errors in a positional relationship between blades can be reduced to arrange the blades in k-space properly, and artifacts and uneven brightness can be prevented even in any of the cases: 1) a case where dynamic and static errors coexist; 2) a case where imaging is performed using the reception coil 161 with local sensitivity distribution; and 3) a case of using a pulse sequence subject to influence of static magnetic field inhomogeneity such as a gradient echo sequence. Therefore, a satisfactory image using the radial scan method can be acquired.

Also, in the first embodiment, a k-space coordinate is generated by calculating a shift amount after performing error measurement for measurement data of all the multi-echoes in case of multi-echo measurement. On the contrary to this, for example, the same process is performed only for measurement data of the number of multi-echo within a required range based on a time constant of an eddy current in the present embodiment. Therefore, according to the present embodiment, additionally, TR (Time of Repetition) is shortened as pulses to be applied in an error measurement sequence are omitted, which can shorten a measurement time of error measurement and a processing time to generate a k-space coordinate.

Also, although the number of multi-echo for performing error measurement is limited based on a time constant of an eddy current in the present embodiment, the number is not limited to this. For example, in a case where a component causing an error magnetic field due to mechanical vibration and the like other than an eddy current has been already known, the number of multi-echo may be limited for performing error measurement using the component.

Also, although calculation accuracy is evaluated using the formulas (7) and (8) to set a representative value of a reception channel in the above respective embodiments, the setting is not limited to this method. For example, first-order coefficients a1 calculated in all the reception channels may be simply averaged to set the average coefficient as a shift amount in k-space.

Also, although phase-difference data is approximated by a first-order straight line for each reception channel in order to calculate a shift amount in k-space in the above respective embodiments, the calculation is not limited to this. For example, the shift amount calculation process may be executed after performing complex synthesis for echo data of all the reception channels. In this case, the repeating loop S1205 during the shift amount calculation process can be omitted.

Additionally, although a shift amount calculation process is performed after obtaining all the error measurement echo groups 212 during an error measurement process in the above respective embodiments, the calculation is not limited to this. For example, it may be configured so that a shift amount in the said axis direction is calculated at the time when all the error measurement echo groups 212 for a particular axis are obtained.

Additionally, the present invention is not limited to the above embodiments. Error components to be reflected to k-space coordinate generation may include not only a dynamic error but also a static error.

DESCRIPTION OF REFERENCE NUMERALS

100: MRI apparatus
101: object
120: static magnetic field generation system
130: gradient magnetic field generation system
131: gradient magnetic field coil
132: gradient magnetic field power source
140: sequencer
150: transmission system
151: transmission coil
152: high-frequency oscillator
153: modulator
154: high-frequency amplifier
160: reception system
161: reception coil
162: signal amplifier
163: quadrature phase detector
164: A/D converter
170: control processing system
171: CPU
172: storage device
173: display device
174: input device
201: error measuring unit
202: shift amount calculation unit
203: k-space coordinate calculation unit
204: reconstruction unit
205: image measuring unit
211: readout gradient magnetic field waveform
212: error measurement echo group
213: X-, Y-, and Z-axis shift amounts 214: corrected k-space coordinate
215: imaging echo group
301: RF pulse
302: RF pulse
303: slice-selective gradient magnetic field pulse
304-1: readout gradient magnetic field pulse
304-2: readout gradient magnetic field pulse
305-1: positive-polarity echo signal
305-2: positive-polarity echo signal
310: sequence with a positive-polarity readout gradient magnetic field pulse
314-1: readout gradient magnetic field pulse
314-2: readout gradient magnetic field pulse
315-1: negative-polarity echo signal
315-2: negative-polarity echo signal
320: sequence with a negative-polarity readout gradient magnetic field pulse
411: image
412: image
421: image
422: image
503: slice-selective gradient magnetic field pulse
504: readout gradient magnetic field pulse
510: pulse sequence of an image acquisition sequence
520: pulse sequence of an error measurement sequence
611: k-space trajectory of radial scanning
612: k-space trajectory of hybrid-radial scanning
621: data arrangement in k-space
622: data arrangement in k-space
630: blade

The invention claimed is:

1. A magnetic resonance imaging apparatus comprising:
an image measuring unit that controls an application of a readout gradient magnetic field pulse according to the pulse sequence of a radial sampling method and executes an image acquisition sequence for measuring an echo signal for image reconstruction in order to acquire measurement data;
a shift amount calculation unit that separates a plurality of factors shifting a position of the echo signal in k-space in order to calculate a shift amount for each blade;
a k-space coordinate calculation unit that reflects the calculated shift amount and corrects a coordinate of the measurement data in non-orthogonal coordinate system k-space in order to calculate a corrected k-space coordinate; and
a reconstruction unit that rearranges the measurement data in the orthogonal coordinate system k-space based on the corrected k-space coordinate in order to reconstruct an image,
wherein the shift amount calculation unit calculates the shift amount from positive-polarity and negative-polarity echo signals obtained by respectively applying a readout gradient magnetic field pulse having the same pulse shape as a readout gradient magnetic field pulse to be used in the image acquisition sequence with the respective positive and negative polarities.

2. The magnetic resonance imaging apparatus according to claim 1, further including:
an error measuring unit that executes an error measurement sequence for obtaining the positive-polarity and negative-polarity echo signals,
wherein a pulse sequence to be used in the image acquisition sequence is a multi-echo measurement sequence,
wherein the error measurement sequence is comprised of:
a sequence with a positive-polarity readout gradient magnetic field pulse that applies readout gradient magnetic field pulses with the same pulse shape as all the readout gradient magnetic field pulses to be used in the multi-echo measurement sequence with the positive polarity in order to obtain positive-polarity echo signals respectively; and
a sequence with a negative-polarity readout gradient magnetic field pulse that applies readout gradient magnetic field pulses with the same pulse shape as all the readout gradient magnetic field pulses to be used in the multi-echo measurement sequence with the negative polarity in order to obtain negative-polarity echo signals respectively, and
wherein the shift amount calculation unit calculates the shift amounts for a plurality of positive-polarity and negative-polarity echo signals having different echo times for each of the echo times.

3. The magnetic resonance imaging apparatus according to claim 1, further comprising:
an error measuring unit that executes an error measurement sequence for obtaining the positive-polarity and negative-polarity echo signals,
wherein a pulse sequence to be used in the image acquisition sequence is a multi-echo measurement sequence, and
wherein the error measurement sequence is comprised of:
a sequence with a positive-polarity readout gradient magnetic field pulse that applies readout gradient magnetic field pulses with the same pulse shape as the said readout gradient magnetic field pulses respectively for readout gradient magnetic field pulses with a different pulse shape from among readout gradient magnetic field pulses to be used in the multi-echo measurement sequence with the positive polarity in order to obtain the positive-polarity echo signals respectively; and
a sequence with a negative-polarity readout gradient magnetic field pulse that respectively applies readout gradient magnetic field pulses applied in the sequence with a positive-polarity readout gradient magnetic field pulse with the negative polarity in order to obtain the negative-polarity echo signals respectively.

4. The magnetic resonance imaging apparatus according to claim 3,
wherein the shift amount calculation unit calculates the shift amounts for a plurality of positive-polarity and negative-polarity echo signals having different echo times for each of the echo times,
the k-space coordinate calculation unit calculates the corrected k-space coordinate from the calculated shift amounts, and
the reconstruction unit performs the reconstruction for measurement data that is to be obtained in the image acquisition sequence and obtained by applying a readout gradient magnetic field pulse of an image acquisition sequence in which the corrected k-space coordinate has not been calculated, using the corrected k-space coordinate calculated from the positive-polarity and negative-polarity echo signals obtained by applying a readout gradient magnetic field pulse with the same pulse shape as the said readout gradient magnetic field pulse.

5. The magnetic resonance imaging apparatus according to claim 3,
wherein the error measuring unit sets a readout gradient magnetic field pulse in which influence of an eddy current is the same to the readout gradient magnetic field pulse with the same pulse shape.

6. The magnetic resonance imaging apparatus according to claim 1,
wherein the shift amount calculation unit obtains the shift amount from a phase difference between positive-polarity data acquired by performing the Fourier transform for the positive-polarity echo signals and negative-polarity data acquired by performing the Fourier transform for the negative-polarity echo signals.

7. The magnetic resonance imaging apparatus according to claim 6,
wherein the shift amount calculation unit calculates the shift amount based on a first-order gradient of the phase difference.

8. A magnetic resonance imaging apparatus comprising:
an image measuring unit that controls an application of a readout gradient magnetic field pulse according to the pulse sequence of a radial sampling method and executes an image acquisition sequence for measuring an echo signal for image reconstruction in order to acquire measurement data;
a shift amount calculation unit that separates a plurality of factors shifting a position of the echo signal in k-space in order to calculate a shift amount for each blade;
a k-space coordinate calculation unit that reflects the calculated shift amount and corrects a coordinate of the measurement data in non-orthogonal coordinate system k-space in order to calculate a corrected k-space coordinate; and
a reconstruction unit that rearranges the measurement data in the orthogonal coordinate system k-space based on the corrected k-space coordinate in order to reconstruct an image,
a reception coil that has a plurality of channels,
wherein the shift amount calculation unit calculates a shift amount candidate and a calculation accuracy of the said shift amount candidate for each of the channels and sets the shift amount candidate of a channel with the highest calculation accuracy as the shift amount.

9. The magnetic resonance imaging apparatus according to claim 8,
wherein the shift amount is generated due to an application area error of the readout gradient magnetic field pulse.

10. The magnetic resonance imaging apparatus according to claim 8,
wherein the shift amount calculation unit calculates the shift amount for each axis of X, Y, and Z of the said magnetic resonance imaging apparatus, and
the k-space coordinate calculation unit obtain the corrected k-space coordinate by calculating a shift amount in the frequency encoding direction for each of the blades from the shift amount for each axis and adding a shift amount in the frequency encoding direction corresponding to the k-space coordinate of the measurement data acquired in the image acquisition sequence.

11. A magnetic resonance imaging method comprising the steps of:
applying gradient magnetic field pulses with the same pulse shape as readout gradient magnetic field pulses to be used in an image acquisition sequence with the positive polarity in order to obtain positive-polarity echo signals and applying the gradient magnetic field pulses with the negative polarity in order to obtain negative-polarity echo signals;
separating a plurality of factors shifting a position in k-space of an echo signal to be obtained in the image acquisition sequence using the positive-polarity echo signals and the negative-polarity echo signals in order to calculate a shift amount for each blade; and
reflecting the shift amount to calculate a corrected k-space coordinate of measurement data, controlling an application of a readout gradient magnetic field pulse according to a pulse sequence of a radial sampling method, and executing an image acquisition sequence for measuring an echo signal in order to reconstruct an image using the corrected k-space coordinate.

* * * * *